(12) United States Patent
Ballantine et al.

(10) Patent No.: US 10,989,760 B2
(45) Date of Patent: *Apr. 27, 2021

(54) SYSTEM AND METHOD FOR IMPEDANCE TESTING DC POWER SOURCES

(71) Applicant: BLOOM ENERGY CORPORATION, Sunnyvale, CA (US)

(72) Inventors: Arne Ballantine, Palo Alto, CA (US); Ranganathan Gurunathan, Bangalore (IN); Anilkumar Vishnuvarjula, Bangalore (IN); Chockkalingam Karuppaiah, Cupertino, CA (US)

(73) Assignee: BLOOM ENERGY CORPORATION, San Jose, CA (US)

( * ) Notice: Subject to any disclaimer, the term of this patent is extended or adjusted under 35 U.S.C. 154(b) by 174 days.

This patent is subject to a terminal disclaimer.

(21) Appl. No.: 16/233,303

(22) Filed: Dec. 27, 2018

(65) Prior Publication Data

US 2020/0209317 A1  Jul. 2, 2020

(51) Int. Cl.
*G01R 31/389* (2019.01)
*G01R 31/382* (2019.01)
(Continued)

(52) U.S. Cl.
CPC ......... *G01R 31/389* (2019.01); *G01R 31/382* (2019.01); *G01R 31/392* (2019.01);
(Continued)

(58) Field of Classification Search
CPC .. G01R 31/389; G01R 31/392; G01R 31/396; G01R 31/382; H01M 10/44; H01M 10/48; H02M 7/44; H02M 1/14
See application file for complete search history.

(56) References Cited

U.S. PATENT DOCUMENTS 6,756,141 B2   6/2004  Miller et al.
8,652,697 B2   2/2014  Gottmann et al.
(Continued)

FOREIGN PATENT DOCUMENTS

WO   WO2004-070343 A2   8/2004

OTHER PUBLICATIONS

Notification of Transmittal of the International Search Report and Written Opinion of the International Search Authority for International Patent Application No. PCT/US2019/067785, dated Apr. 24, 2020, 19 pages.

(Continued)

*Primary Examiner* — Tung X Nguyen
*Assistant Examiner* — Feba Pothen
(74) *Attorney, Agent, or Firm* — The Marbury Law Group PLLC

(57) ABSTRACT

A method includes selecting a test waveform to inject from a first DC converter to at least one first DC power source other than a fuel cell, determining a first resulting ripple that will be generated in response to injecting the test waveform onto the battery, determining at least one offset waveform to inject from at least one second DC converter to at least one second DC power source to generate one or more second ripples which cancel the first resulting ripple, injecting the test waveform from the first DC converter to the at least one first DC power source, injecting the at least one offset waveform from the at least one second DC converter to the at least one second DC power source, and determining a characteristic of the first DC power source based at least in part on the impedance response of the first DC power source.

13 Claims, 18 Drawing Sheets

(51) Int. Cl.
*G01R 31/392* (2019.01)
*H01M 10/44* (2006.01)
*H01M 10/48* (2006.01)
*G01R 31/396* (2019.01)
*H02M 7/44* (2006.01)

(52) U.S. Cl.
CPC .......... *G01R 31/396* (2019.01); *H01M 10/44* (2013.01); *H01M 10/48* (2013.01); *H02M 7/44* (2013.01)

(56) References Cited

U.S. PATENT DOCUMENTS

| | | | |
|---|---|---|---|
| 8,986,900 | B2 | 3/2015 | Gottmann et al. |
| 9,190,681 | B2 | 11/2015 | Gottmann et al. |
| 9,461,319 | B2 | 10/2016 | Sudhan et al. |
| 9,461,320 | B2 | 10/2016 | Ballantine et al. |
| 2005/0287402 | A1* | 12/2005 | Maly ................ H01M 8/04552 702/65 |
| 2010/0216043 | A1 | 8/2010 | Gottmann et al. |
| 2013/0094268 | A1* | 4/2013 | Chapman .............. H02M 7/537 363/132 |
| 2014/0093802 | A1 | 4/2014 | Gottmann et al. |
| 2015/0162632 | A1 | 6/2015 | Gottmann et al. |
| 2015/0228990 | A1 | 8/2015 | Ballantine et al. |
| 2015/0244011 | A1 | 8/2015 | Sudhan S et al. |
| 2015/0326066 | A1* | 11/2015 | Yamada .............. H02M 7/5387 318/440 |
| 2017/0077535 | A1 | 3/2017 | Sudhan S et al. |
| 2017/0219660 | A1 | 8/2017 | Christensen et al. |
| 2018/0321326 | A1* | 11/2018 | Tanaka ................. G01R 31/392 |

OTHER PUBLICATIONS

Ballantine, A. et al., "System and Method for Impedance Testing DC Power Sources," U.S. Appl. No. 16/233,323, filed Dec. 27, 2018.

* cited by examiner

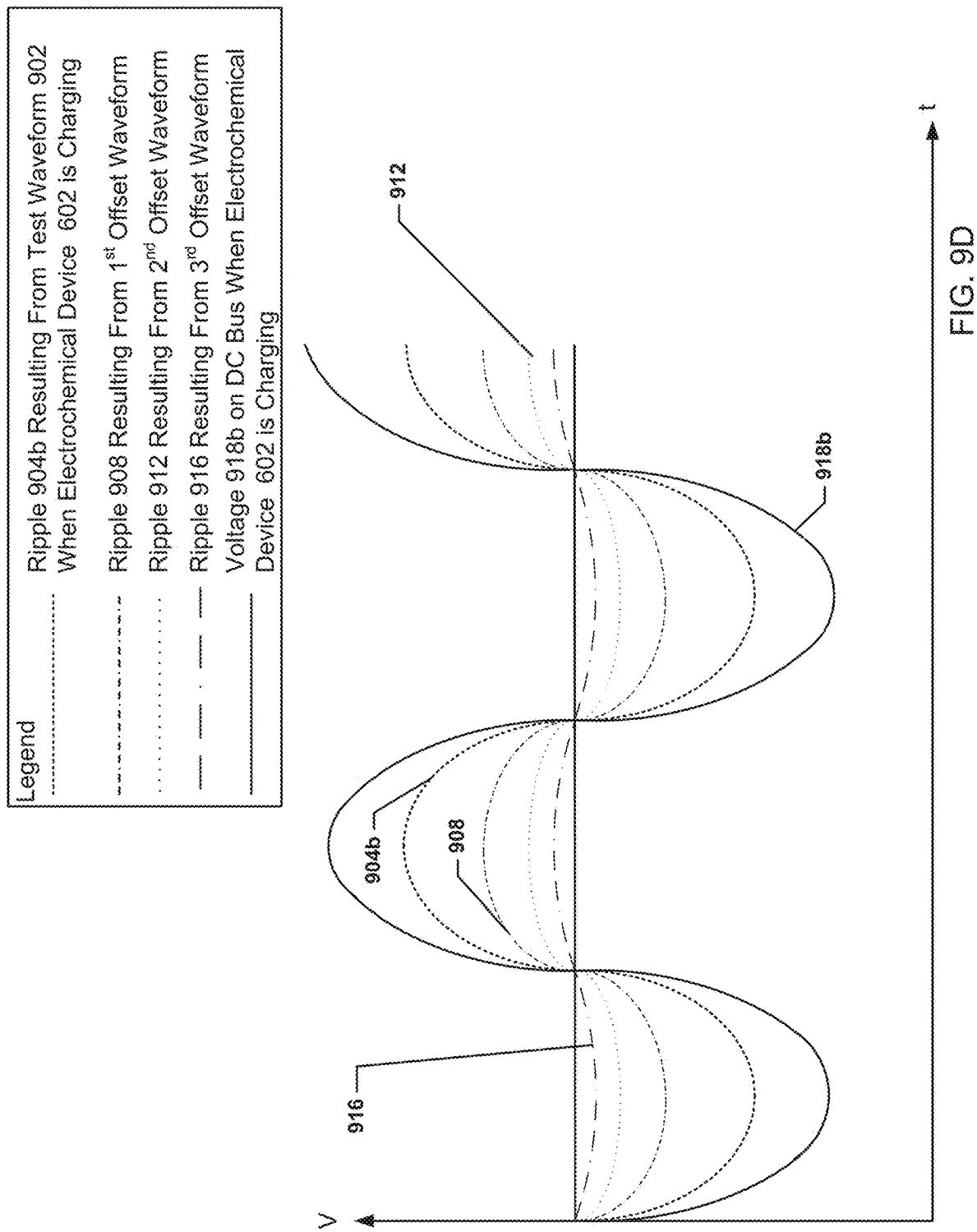

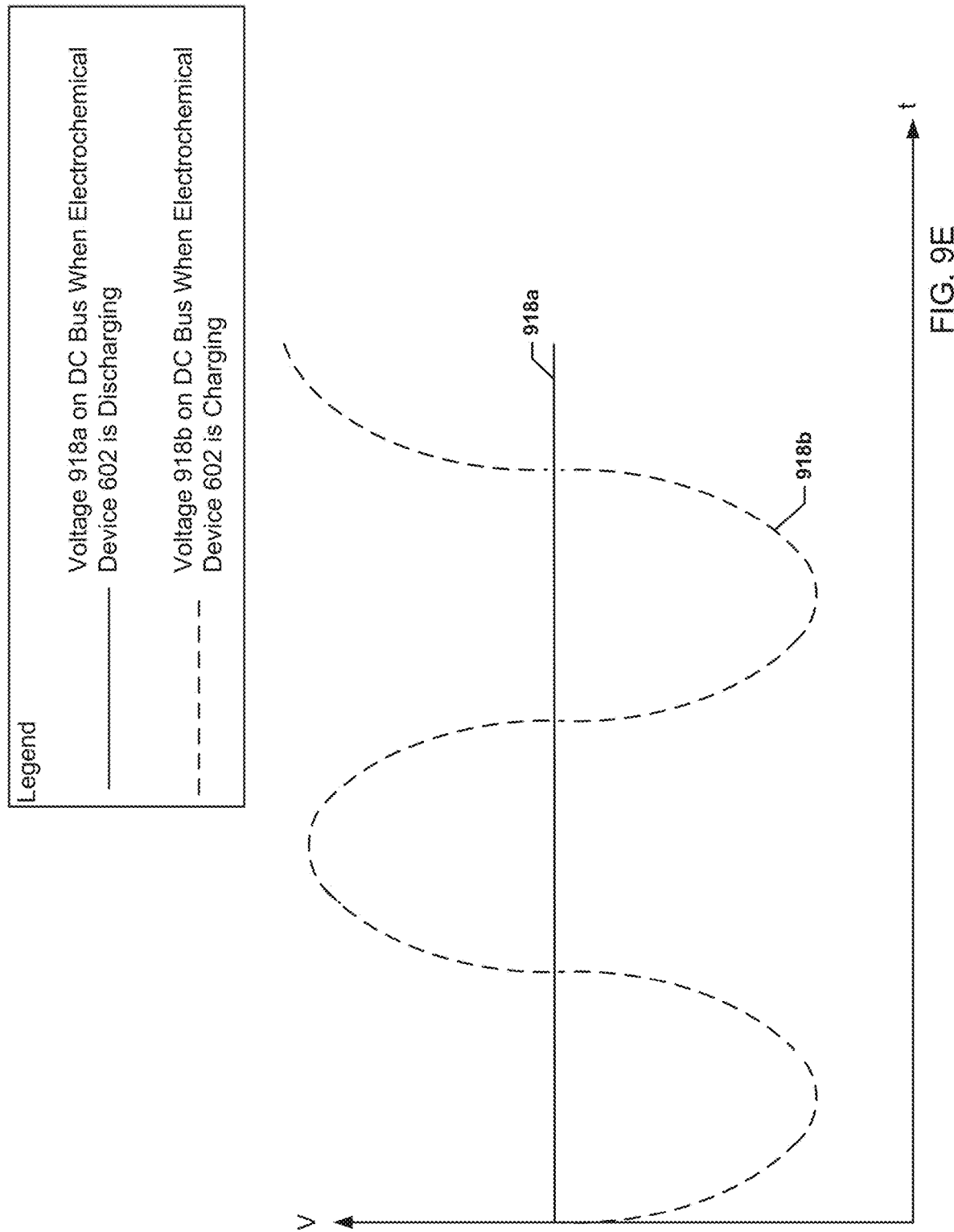

SYSTEM AND METHOD FOR IMPEDANCE TESTING DC POWER SOURCES

BACKGROUND

Information technology ("IT") loads are often deployed in racks or cabinets that in most markets average nowadays 4-6 KW per rack. Technology is getting denser with racks going over 40 KW per rack and even higher for High Performance Computing applications. Applications in the range of 8-35 KW are becoming more and more popular with blades, heavy storage, and networking being integrated for mobility reasons.

Cloud computing is allowing utilization of more distributed configurations with better utilization of existing data centers, public clouds, and new private clouds created in a way that is allowing optimal operation for enterprises or the small and medium business ("SMB") market, for example, by allowing "Everything as a Service" way of utilization for the cloud consumer. "Infrastructure as a Service" models are better synchronized to the requirements of businesses, therefore, there is a need in the market for building blocks for such infrastructure that will allow overall faster time to market at optimal cost.

SUMMARY

According to an aspect of the present disclosure, a system contains a direct current ("DC") bus, a first DC power source other than a fuel cell electrically connected via a first input connection to a first DC converter, wherein the first DC converter is connected via a first output connection to the DC bus, at least one second DC power source other than a fuel cell electrically connected via at least one second input connection to at least one second DC converter, wherein the at least one second DC converter is connected via at least second output connection to the DC bus and wherein the first output connection and the at least one second output connection connect the first DC converter and the at least one second DC converter to the DC bus in parallel, and a processor connected to the first DC converter and the at least one second DC converter. The processor is configured with processor-executable instructions to perform operations comprising selecting a test waveform to inject onto the first input connection from the first DC converter to the first DC power source other than a fuel cell, determining a first resulting ripple on the first output connection that will be generated in response to injecting the test waveform onto the first input connection, determining at least one offset waveform to inject onto the at least one second input connection from the at least one second DC converter to the at least one second DC power source other than a fuel cell such that one or more second ripples which will be provided to the at least one second output connection cancel the first resulting ripple, controlling the first DC converter to inject the test waveform onto the first input connection, and controlling the at least one second DC converter to inject the at least one offset waveform onto the at least one second input connection.

According to another aspect of the present disclosure, a system contains an alternating current ("AC") bus, a first direct current ("DC") power source electrically connected via a first input connection to a first inverter, wherein the first inverter is connected via a first output connection to the AC bus, at least one second DC power source electrically connected via at least one second input connection to at least one second inverter, wherein the at least one second inverter is connected via at least second output connection to the AC bus and wherein the first output connection and the at least one second output connection connect the first inverter and the at least one second inverter to the AC bus in parallel, and a processor connected to the first inverter and the at least one second inverter. The processor is configured with processor-executable instructions to perform operations comprising selecting a test waveform to inject onto the first input connection from the first inverter to the first DC power source, determining a first resulting ripple on the first output connection that will be generated in response to injecting the test waveform onto the first input connection, determining at least one offset waveform to inject onto the at least one second input connection from the at least one second inverter to the at least one second DC power source such that one or more second ripples which will be provided to the at least one second output connection cancel the first resulting ripple, controlling the first inverter to inject the test waveform onto the first input connection, and controlling the at least one second inverter to inject the at least one offset waveform onto the at least one second input connection.

According to another aspect of the present disclosure, a system contains an alternating current ("AC") bus, a first direct current ("DC") power source electrically connected via a first DC power source input connection to a first DC converter, a first inverter connected to the first DC converter via a first DC converter output connection and connected to the AC bus via a first inverter output connection, and a processor connected to the first DC converter. The processor is configured with processor-executable instructions to perform operations comprising selecting a test waveform to inject onto the first DC converter output connection from the first DC converter to the first inverter, controlling the first DC converter to inject the test waveform onto the first DC converter output connection, and measuring a response from the inverter to the test waveform.

According to another aspect of the present disclosure, a method includes selecting a test waveform to inject from a first DC converter to at least one first DC power source other than a fuel cell, determining a first resulting ripple that will be generated in response to injecting the test waveform onto the battery, determining at least one offset waveform to inject from at least one second DC converter to at least one second DC power source to generate one or more second ripples which cancel the first resulting ripple, injecting the test waveform from the first DC converter to the at least one first DC power source, injecting the at least one offset waveform from the at least one second DC converter to the at least one second DC power source, and determining a characteristic of the first DC power source based at least in part on the impedance response of the first DC power source.

According to another aspect of the present disclosure, a system includes a direct current ("DC") bus, a battery electrically connected via a first input connection to a first DC converter, wherein the first DC converter is connected via a first output connection to the DC bus, at least one second DC power source electrically connected via at least one second input connection to at least one second DC converter, wherein the at least one second DC converter is connected via at least second output connection to the DC bus and wherein the first output connection and the at least one second output connection connect the first DC converter and the at least one second DC converter to the DC bus in parallel, and a processor connected to the first DC converter and the at least one second DC converter. The processor is configured with processor-executable instructions to perform operations comprising selecting a test waveform to inject onto the first input connection from the first DC converter to the battery, determining a first resulting ripple on the first output connection that will be generated in response to injecting the test waveform onto the first input connection, determining at least one offset waveform to inject onto the at least one second input connection from the at least one second DC converter to the at least one second DC power source such that one or more second ripples which will be provided to the at least one second output connection will cancel the first resulting ripple if the battery is charging, controlling the first DC converter to inject the test waveform onto the first input connection, controlling the at least one second DC converter to inject the at least one offset waveform onto the at least one second input connection, measuring an output on the first DC converter output connection, and determining if the battery is charging or discharging based on the measured output.

According to another aspect of the present disclosure, a method includes selecting a test waveform to inject to a battery from a first DC converter, determining a first resulting ripple that will be generated in response to injecting the test waveform, determining at least one offset waveform to inject to at least one second DC power source from at least one second DC converter such that one or more second ripples will be provided that will cancel the first resulting ripple if the battery is charging, injecting the test waveform to the battery, injecting the at least one offset waveform to the at least one second DC power source, determining if the first resulting ripple has been cancelled, and determining if the battery is charging or discharging based on the step of determining if the first resulting ripple has been cancelled.

DESCRIPTION OF THE DRAWINGS

FIG. 9D is a graph illustrating non-canceling ripples on a DC bus over time using the waveforms shown in FIG. 9C when an electrochemical device is in charging mode according to an embodiment.

FIG. 9E compares a voltage ripple on the DC bus when electromechanical device is discharging to the voltage ripple when the electromechanical device is charging according to an embodiment.

DETAILED DESCRIPTION

Figure 1:
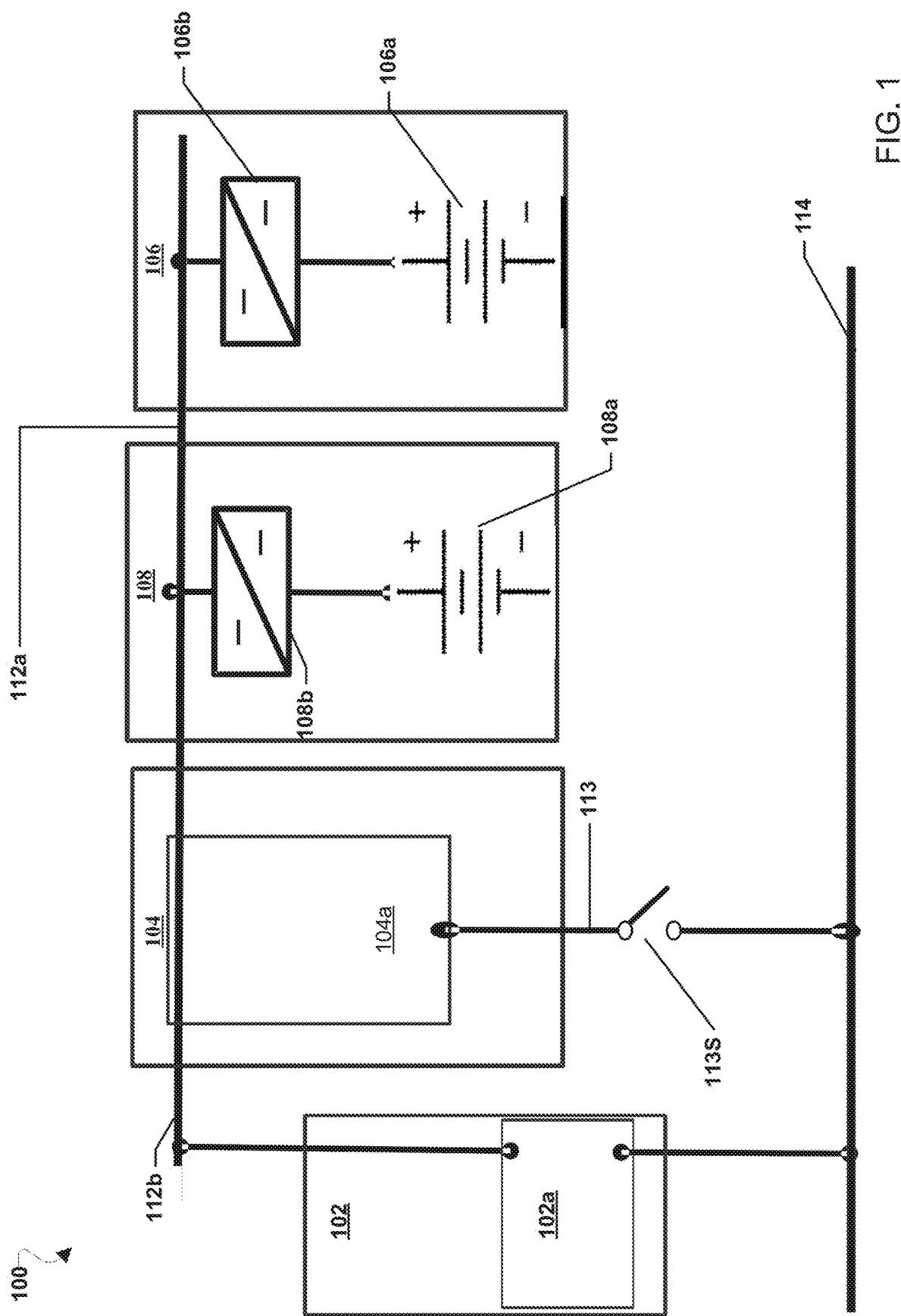
FIG. 1 is a block diagram illustrating a fuel cell system that can be used with the exemplary embodiments.

Referring to FIG. 1, one exemplary fuel cell system 100 includes a DC load 102, such as an information technology (IT) load (i.e., devices operating in an IT system which may include one or more of computer(s), server(s), modem(s), router(s), rack(s), power supply connections, and other components found in a data center environment), an input/output module (IOM) 104, and one or more power modules 106, as described in U.S. application Ser. No. 13/937,312 incorporated herein by reference in its entirety. As shown in FIG. 1, the DC load 102 may include one or more backup power supplies 102a connected to grid 114.

The IOM 104 may comprise one or more power conditioning components 104a whose input is connected to a DC bus 112a and whose output(s) are connected to the load 102 via a main AC bus 112b and optionally to the grid 114 via auxiliary AC bus 113 containing a switch 113S. The one or more power conditioning components 104a may include components for converting DC power to AC power, such as a DC/AC inverter 104a (e.g., a DC/AC inverter described in U.S. Pat. No. 7,705,490, incorporated herein by reference in its entirety), electrical connectors for AC power output to the grid, circuits for managing electrical transients, a system controller (e.g., a computer or dedicated control logic device or circuit), etc. The power conditioning components 104a may be designed to convert DC power from the fuel cell modules to different AC voltages and frequencies. Designs for 208V, 60 Hz; 480V, 60 Hz; 415V, 50 Hz and other common voltages and frequencies may be provided.

Each power module 106 cabinet is configured to house a DC power source 106a. The DC power source 106a may include, for example, a battery. The DC power source 106a may instead or in addition include a photovoltaic cell, a supercapacitor or a fuel cell. One example of a suitable DC power source is a stack of solid oxide fuel cells (SOFCs).

For example, the DC power source 106a may be a fuel cell DC power source that includes one or more hot boxes. A hot box contains one or more stacks or columns of fuel cells (generally referred to as "segments"), such as one or more stacks or columns of solid oxide fuel cells having a ceramic oxide electrolyte separated by conductive interconnect plates. Other fuel cell types, such as polymer electrolyte membrane ("PEM"), molten carbonate, phosphoric acid, etc., may also be used.

Fuel cells are often combined into units called "stacks" in which the fuel cells are electrically connected in series and separated by electrically conductive interconnects, such as gas separator plates which function as interconnects. A fuel cell stack may contain conductive end plates on its ends. A generalization of a fuel cell stack is the so-called fuel cell segment or column, which can contain one or more fuel cell stacks connected in series (e.g., where the end plate of one stack is connected electrically to an end plate of the next stack). A fuel cell segment or column may contain electrical leads which output the direct current from the segment or column to a power conditioning system. A fuel cell system can include one or more fuel cell columns, each of which may contain one or more fuel cell stacks, such as solid oxide fuel cell stacks.

The fuel cell stacks may be internally manifolded for fuel and externally manifolded for air, where only the fuel inlet and exhaust risers extend through openings in the fuel cell layers and/or in the interconnect plates between the fuel cells, as described in U.S. Pat. No. 7,713,649, which is incorporated herein by reference in its entirety. The fuel cells may have a cross flow (where air and fuel flow roughly perpendicular to each other on opposite sides of the electrolyte in each fuel cell), counter flow parallel (where air and fuel flow roughly parallel to each other but in opposite directions on opposite sides of the electrolyte in each fuel cell) or co-flow parallel (where air and fuel flow roughly parallel to each other in the same direction on opposite sides of the electrolyte in each fuel cell) configuration.

The DC power source 106a may be connected to one or more the DC buses 112 such as a split DC bus, by one or more DC/DC converters 106b located in module 106. The DC/DC converters 106b may be located anywhere in the fuel cell system, for example in the IOM 104 instead of the power modules 106.

The system 100 may also optionally include an energy storage module 108 including a storage device 108a, such as a bank of supercapacitors, batteries, flywheel, etc. The storage device 108a may also be connected to the DC bus 112 using one or more DC/DC converters 108b as shown in FIG. 1. Alternatively, the storage devices 108a may be located in the power module 106 and/or together with the IT load 102.

Figure 2:
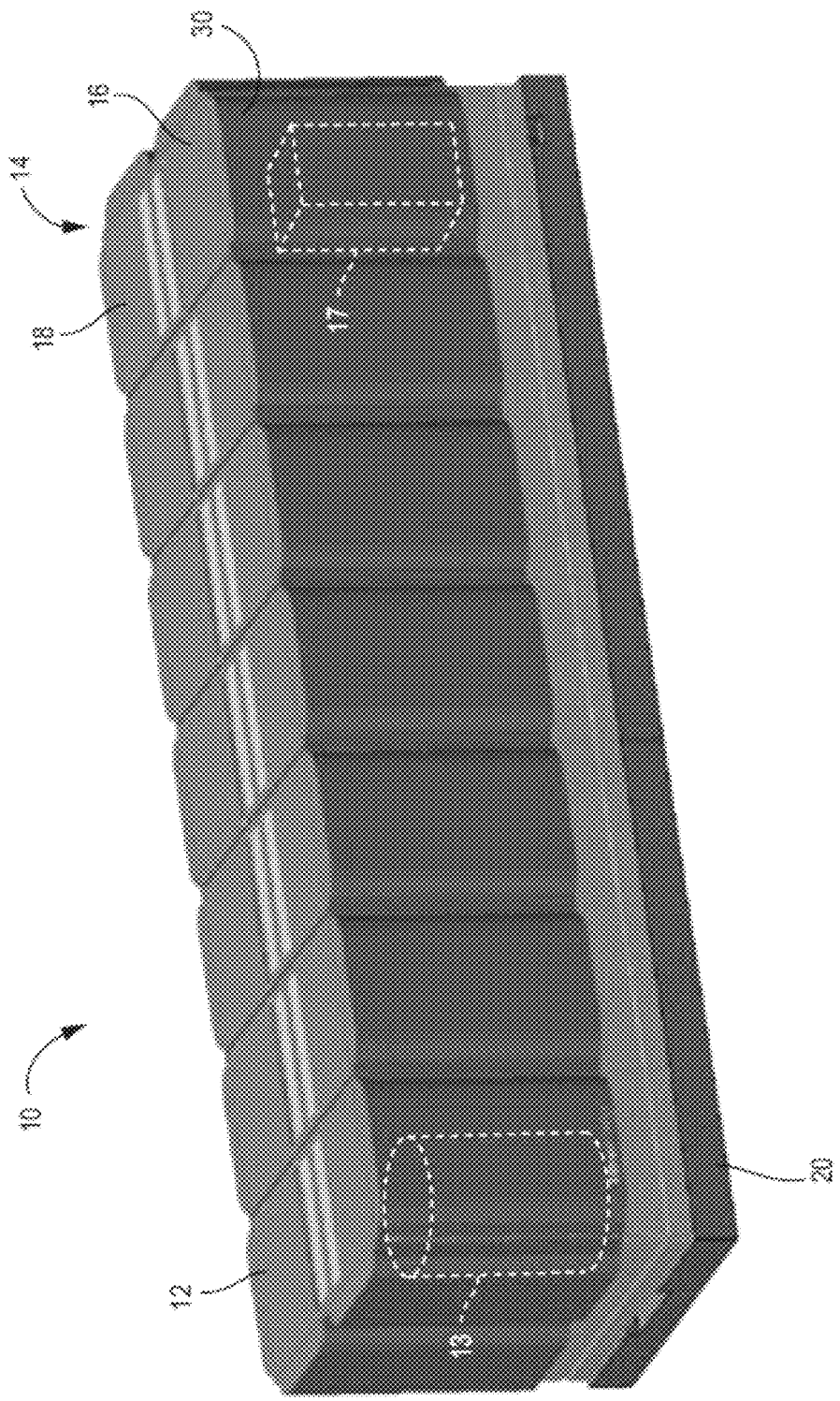
FIG. 2 is an isometric view of a modular fuel cell system enclosure that can be used with the exemplary embodiments.
Figure 5:
FIG. 5 is photograph of the housing of the modular fuel cell system of FIG. 2.

FIGS. 2 and 5 illustrate an exemplary modular fuel cell system described in U.S. Pat. No. 8,440,362, incorporated herein by reference in their entirety.

The modular system may contain modules and components described above as well as in U.S. Pat. No. 9,190,693, and entitled "Modular Fuel Cell System" which is incorporated herein by reference in its entirety. The modular design of the fuel cell system enclosure 10 provides flexible system installation and operation. Modules allow scaling of installed generating capacity, reliable generation of power, flexibility of fuel processing, and flexibility of power output voltages and frequencies with a single design set. The modular design results in an "always on" unit with very high availability and reliability. This design also provides an easy means of scale up and meets specific requirements of customer's installations. The modular design also allows the use of available fuels and required voltages and frequencies which may vary by customer and/or by geographic region.

The modular fuel cell system enclosure 10 includes a plurality of power module housings 12 (containing a fuel cell power module components 70, where the housing 12 and its components 70 are jointly labeled 106 in FIG. 1), one or more fuel input (i.e., fuel processing) module housings 16, and one or more power conditioning (i.e., electrical output) module housings 18 (where the housing and its contents are labeled 104 and referred to as "IOM" in FIG. 1). For example, the system enclosure may include any desired number of modules, such as 2-30 power modules, for example 6-12 power modules. FIG. 2 illustrates a system enclosure 10 containing six power modules (one row of six modules stacked side to side), one fuel processing module, and one power conditioning module, on a common base 20. Each module may comprise its own cabinet or housing. Alternatively, as will be described in more detail below, the power conditioning (i.e., IOM) and fuel processing modules may be combined into a single input/output module located in one cabinet or housing 14. For brevity, each housing 12, 14, 16, 18 will be referred to as "module" below.

While one row of power modules 12 is shown, the system may comprise more than one row of modules 12. For example, the system may comprise two rows of power modules stacked back to back.

Each power module 12 is configured to house one or more hot boxes 13. Each hot box contains one or more stacks or columns of fuel cells (not shown for clarity), such as one or more stacks or columns of solid oxide fuel cells having a ceramic oxide electrolyte separated by conductive interconnect plates. Other fuel cell types, such as PEM, molten carbonate, phosphoric acid, etc. may also be used.

The modular fuel cell system enclosure 10 also contains one or more input or fuel processing modules 16. This module 16 includes a cabinet which contains the components used for pre-processing of fuel, such as desulfurizer beds. The fuel processing modules 16 may be designed to process different types of fuel. For example, a diesel fuel processing module, a natural gas fuel processing module, and an ethanol fuel processing module may be provided in the same or in separate cabinets. A different bed composition tailored for a particular fuel may be provided in each module. The processing module(s) 16 may processes at least one of the following fuels selected from natural gas provided from a pipeline, compressed natural gas, methane, propane, liquid petroleum gas, gasoline, diesel, home heating oil, kerosene, JP-5, JP-8, aviation fuel, hydrogen, ammonia, ethanol, methanol, syn-gas, bio-gas, bio-diesel and other suitable hydrocarbon or hydrogen containing fuels. If desired, a reformer 17 may be located in the fuel processing module 16. Alternatively, if it is desirable to thermally integrate the reformer 17 with the fuel cell stack(s), then a separate reformer 17 may be located in each hot box 13 in a respective power module 12. Furthermore, if internally reforming fuel cells are used, then an external reformer 17 may be omitted entirely.

The modular fuel cell system enclosure 10 also contains one or more power conditioning modules 18. The power conditioning module 18 includes a cabinet which contains the components for converting the fuel cell stack generated DC power to AC power (e.g., DC/DC and DC/AC converters described in U.S. Pat. No. 7,705,490, incorporated herein by reference in its entirety), electrical connectors for AC power output to the grid, circuits for managing electrical transients, a system controller (e.g., a computer or dedicated control logic device or circuit). The power conditioning module 18 may be designed to convert DC power from the fuel cell modules to different AC voltages and frequencies. Designs for 208V, 60 Hz; 480V, 60 Hz; 415V, 50 Hz and other common voltages and frequencies may be provided.

The fuel processing module 16 and the power conditioning module 18 may be housed in one input/output cabinet 14. If a single input/output cabinet 14 is provided, then modules 16 and 18 may be located vertically (e.g., power conditioning module 18 components above the fuel processing module 16 desulfurizer canisters/beds) or side by side in the cabinet 14.

As shown in one exemplary embodiment in FIG. 2, one input/output cabinet 14 is provided for one row of six power modules 12, which are arranged linearly side to side on one side of the input/output module 14. The row of modules may be positioned, for example, adjacent to a building for which the system provides power (e.g., with the backs of the cabinets of the modules facing the building wall). While one row of power modules 12 is shown, the system may comprise more than one row of modules 12. For example, as noted above, the system may comprise two rows of power modules stacked back to back.

The linear array of power modules 12 is readily scaled. For example, more or fewer power modules 12 may be provided depending on the power needs of the building or other facility serviced by the fuel cell system 10. The power modules 12 and input/output modules 14 may also be provided in other ratios. For example, in other exemplary embodiments, more or fewer power modules 12 may be provided adjacent to the input/output module 14. Further, the support functions could be served by more than one input/output module 14 (e.g., with a separate fuel processing module 16 and power conditioning module 18 cabinets). Additionally, while in one embodiment, the input/output module 14 is at the end of the row of power modules 12, it could also be located in the center of a row of power modules 12.

The modular fuel cell system enclosure 10 may be configured in a way to ease servicing of the system. All of the routinely or high serviced components (such as the consumable components) may be placed in a single module to reduce amount of time required for the service person. For example, the desulfurizer material for a natural gas fueled system may be placed in a single module (e.g., a fuel processing module 16 or a combined input/output module 14 cabinet). This would be the only module cabinet accessed during routine maintenance. Thus, each module 12, 14, 16, and 18 may be serviced, repaired or removed from the system without opening the other module cabinets and without servicing, repairing or removing the other modules.

For example, as described above, the enclosure 10 can include multiple power modules 12. When at least one power module 12 is taken off line (i.e., no power is generated by the stacks in the hot box 13 in the off line module 12), the remaining power modules 12, the fuel processing module 16 and the power conditioning module 18 (or the combined input/output module 14) are not taken off line. Furthermore, the fuel cell enclosure 10 may contain more than one of each type of module 12, 14, 16, or 18. When at least one module of a particular type is taken off line, the remaining modules of the same type are not taken off line.

Thus, in a system comprising a plurality of modules, each of the modules 12, 14, 16, or 18 may be electrically disconnected, removed from the fuel cell enclosure 10 and/or serviced or repaired without stopping an operation of the other modules in the system, allowing the fuel cell system to continue to generate electricity. The entire fuel cell system does not have to be shut down if one stack of fuel cells in one hot box 13 malfunctions or is taken off line for servicing.

Each of the power modules 12 and input/output modules 14 include a door 30 (e.g., hatch, access panel, etc.) to allow the internal components of the module to be accessed (e.g., for maintenance, repair, replacement, etc.). According to one embodiment, the modules 12 and 14 are arranged in a linear array that has doors 30 only on one face of each cabinet, allowing a continuous row of systems to be installed abutted against each other at the ends. In this way, the size and capacity of the fuel cell enclosure 10 can be adjusted with additional modules 12 or 14 and bases 20 with minimal rearranging needed for existing modules 12 and 14 and bases 20. If desired, the door to module 14 may be on the side rather than on the front of the cabinet.

The door 30 may open in tandem with a substantially vertical and then substantially horizontal swing (e.g., "gull-wing" style). In other words, the door 30 opens by being moved up and then at least partially over the top of the enclosure 10 in a substantially horizontal direction. The terms substantially vertical and substantially horizontal of this embodiment include a deviation of 0 to 30 degrees, such as 0 to 10 degrees from exact vertical and horizontal directions, respectively.

The door 30 is mounted on to walls of the enclosure or cabinet 10 of the module 12 or 14 with plural independent mechanical arms. In the open position the upper portion of the door 30 may be located over the enclosure or cabinet 10 and the lower portion of the door may optionally overhang the opening to the enclosure 10. In this configuration, the door 30 provides rain and snow protection for a user when open since the lower portion of the door overhangs from the fuel cell system enclosure 10. Alternatively, the entire door 30 may be located over the enclosure 10 in the open position.

Figure 3:
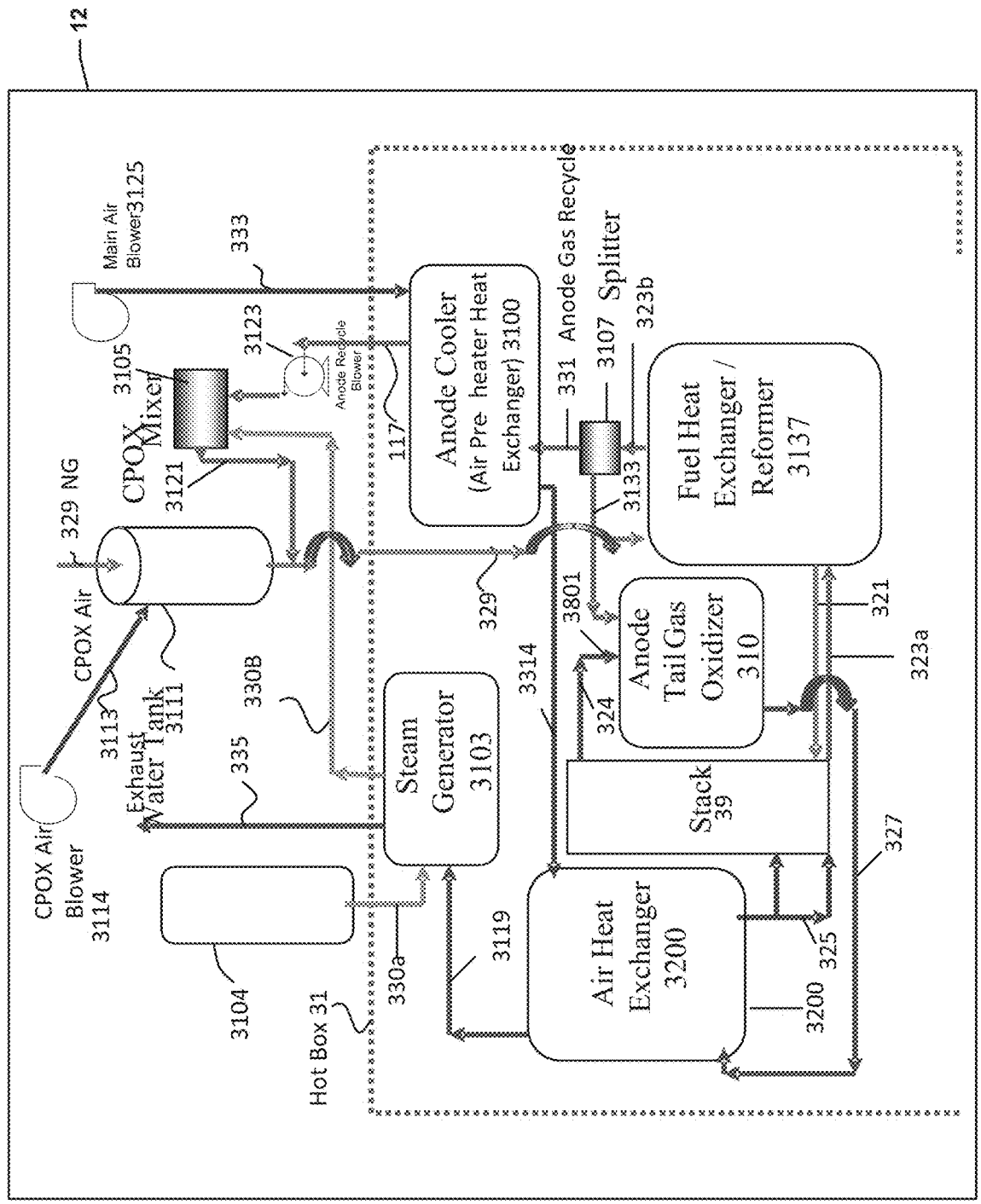
FIG. 3 is a schematic process flow diagram illustrating a hot box that can be used with the exemplary embodiments.

FIG. 3 is a schematic process flow diagram representation of module 12 and the hot box 31 components showing the various flows through the components, as described in more detail in U.S. Pat. No. 9,461,320, incorporated herein by reference in its entirety. In the configuration illustrated in FIG. 3, there may be no fuel and air inputs to the ATO 310. External natural gas or another external fuel may not be fed to the ATO 310. Instead, the hot fuel (anode) exhaust stream from the fuel cell stack(s) 39 is partially recycled into the ATO as the ATO fuel inlet stream. Likewise, there is no outside air input into the ATO. Instead, the hot air (cathode) exhaust stream from the fuel cell stack(s) 39 is provided into the ATO as the ATO air inlet stream.

Furthermore, the fuel exhaust stream is split in a splitter 3107 located in the hot box 1. The splitter 3107 is located between the fuel exhaust outlet of the anode recuperator (e.g., fuel heat exchanger) 3137 and the fuel exhaust inlet of the anode cooler 3100 (e.g., the air pre-heater heat exchanger). Thus, the fuel exhaust stream is split between the mixer 3105 and the ATO 310 prior to entering the anode cooler 3100. This allows higher temperature fuel exhaust stream to be provided into the ATO than in the prior art because the fuel exhaust stream has not yet exchanged heat with the air inlet stream in the anode cooler 3100. For example, the fuel exhaust stream provided into the ATO 310 from the splitter 3107 may have a temperature of above 350 C, such as 350-500 C, for example 375 to 425 C, such as 390-410 C. Furthermore, since a smaller amount of fuel exhaust is provided into the anode cooler 3100 (e.g., not 100% of the anode exhaust is provided into the anode cooler due to the splitting of the anode exhaust in splitter 3107), the heat exchange area of the anode cooler 3100 may be reduced.

The hot box 31 contains the plurality of the fuel cell stacks 39, such as a solid oxide fuel cell stacks (where one solid oxide fuel cell of the stack contains a ceramic electrolyte, such as yttria stabilized zirconia (YSZ) or scandia stabilized zirconia (SSZ), an anode electrode, such as a nickel-YSZ or Ni-SSZ cermet, and a cathode electrode, such as lanthanum strontium manganite (LSM)). The stacks 39 may be arranged over each other in a plurality of columns or segments.

The hot box 31 also contains a steam generator 3103. The steam generator 3103 is provided with water through conduit 330a from a water source 3104, such as a water tank or a water pipe (i.e., a continuous water supply), and converts the water to steam. The steam is provided from generator 3103 to mixer 3105 through conduit 330B and is mixed with the stack anode (fuel) recycle stream in the mixer 3105. The mixer 3105 may be located inside or outside the hot box of the hot box 31. Preferably, the humidified anode exhaust stream is combined with the fuel inlet stream in the fuel inlet line or conduit 329 downstream of the mixer 3105, as schematically shown in FIG. 3. Alternatively, if desired, the fuel inlet stream may also be provided directly into the mixer 3105, or the steam may be provided directly into the fuel inlet stream and/or the anode exhaust stream may be provided directly into the fuel inlet stream followed by humidification of the combined fuel streams.

The steam generator 3103 is heated by the hot ATO 310 exhaust stream which is passed in heat exchange relationship in conduit 3119 with the steam generator 3103.

The system operates as follows. The fuel inlet stream, such as a hydrocarbon stream, for example natural gas, is provided into the fuel inlet conduit 329 and through a catalytic partial pressure oxidation (CPOx) reactor 3111 located outside the hot box. During system start up, air is also provided into the CPOx reactor 3111 through CPOx air inlet conduit 3113 to catalytically partially oxidize the fuel inlet stream. The air may be blown through the air inlet conduit 3113 to the CPOx reactor 3111 by a CPOx air blower 3114. The CPOx air blower 3114 may only operate during startup. During steady state system operation, the air flow is turned off (e.g., by powering off the CPOx air blower 3114) and the CPOx reactor acts as a fuel passage way in which the fuel is not partially oxidized. Thus, the hot box 31 may comprise only one fuel inlet conduit which provides fuel in both start-up and steady state modes through the CPOx reactor 3111. Therefore a separate fuel inlet conduit which bypasses the CPOx reactor during steady state operation is not required.

The fuel inlet stream is provided into the fuel heat exchanger (anode recuperator)/pre-reformer 3137 where its temperature is raised by heat exchange with the stack 39 anode (fuel) exhaust streams. The fuel inlet stream is pre-reformed in the pre-reformer section of the heat exchanger 3137 and the reformed fuel inlet stream (which includes hydrogen, carbon monoxide, water vapor and unreformed methane) is provided into the stacks 39 through the fuel inlet conduit(s) 321. The fuel inlet stream travels upwards through the stacks through fuel inlet risers in the stacks 39 and is oxidized in the stacks 39 during electricity generation. The oxidized fuel (i.e., the anode or fuel exhaust stream) travels down the stacks 39 through the fuel exhaust risers and is then exhausted from the stacks through the fuel exhaust conduits 323a into the fuel heat exchanger 3137.

In the fuel heat exchanger 3137, the anode exhaust stream heats the fuel inlet stream via heat exchange. The anode exhaust stream is then provided via the fuel exhaust conduit 323b into a splitter 3107. A first portion of the anode exhaust stream is provided from the splitter 3107 the ATO 310 via conduit (e.g., slits) 3133.

A second portion of the anode exhaust stream is recycled from the splitter 3107 into the anode cooler 3100 and then into the fuel inlet stream. For example, the second portion of the anode exhaust stream is recycled through conduit 331 into the anode cooler (i.e., air pre-heater heat exchanger) where the anode exhaust stream pre-heats the air inlet stream from conduit 333. The anode exhaust stream is then provided by the anode recycle blower 3123 into the mixer 3105. The anode exhaust stream is humidified in the mixer 3105 by mixing with the steam provided from the steam generator 3103. The humidified anode exhaust stream is then provided from the mixer 3105 via humidified anode exhaust stream conduit 3121 into the fuel inlet conduit 329 where it mixes with the fuel inlet stream.

The air inlet stream is provided by a main air blower 3125 from the air inlet conduit 333 into the anode cooler heat exchanger 3100. The blower 3125 may comprise the single air flow controller for the entire system, as described above. In the anode cooler heat exchanger 3100, the air inlet stream is heated by the anode exhaust stream via heat exchange. The heated air inlet stream is then provided into the air heat exchanger (cathode recuperator 3200) via conduit 3314. The heated air inlet stream is provided from heat exchanger 3200 into the stack(s) 39 via the air inlet conduit and/or manifold 325.

The air passes through the stacks 39 into the cathode exhaust conduit 324 and through conduit 324 and mixer 3801 into the ATO 310. In the ATO 310, the air exhaust stream oxidizes the split first portion of the anode exhaust stream from conduit 3133 to generate an ATO exhaust stream. The ATO exhaust stream is exhausted through the ATO exhaust conduit 327 into the air heat exchanger 3200. The ATO exhaust stream heats air inlet stream in the air heat exchanger 3200 via heat exchange. The ATO exhaust stream (which is still above room temperature) is then provided from the air heat exchanger 3200 to the steam generator 3103 via conduit 3119. The heat from the ATO exhaust stream is used to convert the water into steam via heat exchange in the steam generator 3103. The ATO exhaust stream is then removed from the system via the exhaust conduit 335. Thus, by controlling the air inlet blower output (i.e., power or speed), the magnitude (i.e., volume, pressure, speed, etc.) of air introduced into the system may be controlled. The cathode (air) and anode (fuel) exhaust streams are used as the respective ATO air and fuel inlet streams, thus eliminating the need for a separate ATO air and fuel inlet controllers/blowers. Furthermore, since the ATO exhaust stream is used to heat the air inlet stream, the control of the rate of single air inlet stream in conduit 333 by blower 3125 can be used to control the temperature of the stacks 39 and the ATO 310.

Thus, as described above, by varying the main air flow in conduit 333 using a variable speed blower 3125 and/or a control valve to maintain the stack 39 temperature and/or ATO 310 temperature. In this case, the main air flow rate control via blower 3125 or valve acts as a main system temperature controller. Furthermore, the ATO 310 temperature may be controlled by varying the fuel utilization (e.g., ratio of current generated by the stack(s) 39 to fuel inlet flow provided to the stack(s) 39). Finally the anode recycle flow in conduits 331 and 3117 may be controlled by a variable speed anode recycle blower 3123 and/or a control valve to control the split between the anode exhaust to the ATO 310 and anode exhaust for anode recycle into the mixer 3105 and the fuel inlet conduit 329.

Figure 4:
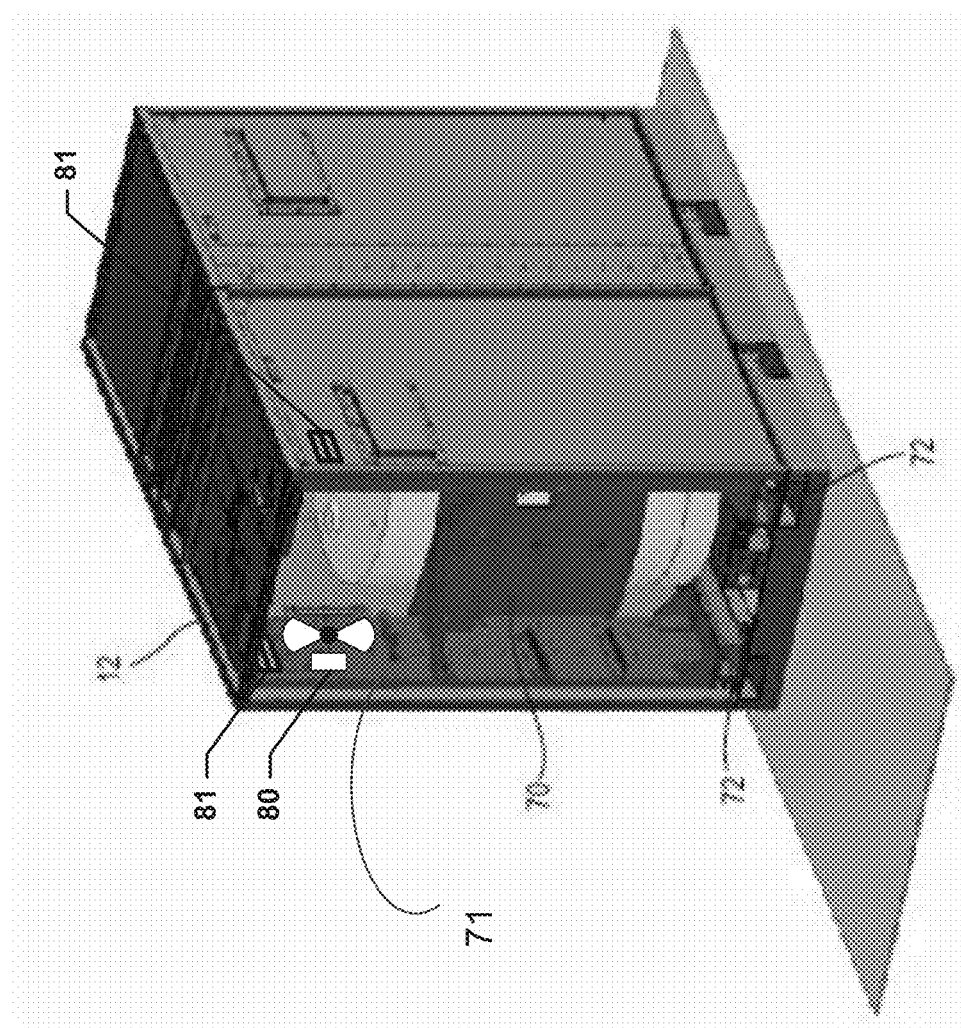
FIG. 4 is an isometric view of a hot box of the modular fuel cell system of FIG. 2.

As shown in FIG. 4, field replaceable power module components (PMC) 70 include the hot box sub-system 13, such as the cylindrical hot box 13 that is shown in FIG. 2. The hot box 13 contains the fuel cell stacks and heat exchanger assembly. The PMC 70 also includes a frame 71 supporting the balance of plant (BOP) sub-system including blowers, valves, and control boards, etc (not shown for clarity) and a removable support 72, such as fork-lift rails, which supports the hot box and the frame. The support 72 allows the PMC 70 to be removed from the power module 12 cabinet as a single unit or assembly. Other configurations may also be used. For example, the hot box 13 may have a shape other than cylindrical, such as polygonal, etc. The support 72 may comprise a platform rather than rails. The frame may have a different configuration or it may be omitted entirely with the BOP components mounted onto the hotbox 13 and/or the support 72 instead. The PMC 70 is dimensionally smaller than the opening in the power module 12 (e.g., the opening closed by the door 30). Additionally, the PMC 70 may include one or more vents 81 for exhausting/ventilating gas, such as air, from within the PMC and module 12 to the outside environment. The PMC 70 may also include one or more ventilation fans or blowers 80, such as a ventilation fan driven by an alternating current motor that may force gas, such as air and/or ATO exhaust, out of the PMC 70, such as out of the one or more vents 81.

To maximize the efficiency and/or longevity of fuel cell stacks, such as the fuel stacks within power module 12 discussed above, proper operating conditions must be maintained. For example, inefficient operation may result if too much or too little fuel is used by the fuel system, or if temperatures of the individual fuel cells of a fuel cell stack deviate from a preferred temperature range. In order to maintain proper operating conditions, it is desirable to continually monitor and adjust the fuel cell system, its support equipment (e.g., support equipment such as blowers, pumps, valves, etc.), and peripheral devices connected to the fuel cell system.

The systems, methods, and devices of the various embodiments enable electrochemical impedance spectroscopy ("EIS") (also called AC impedance spectroscopy) to be performed on electrochemical devices by power electronics connecting the electrochemical devices in parallel to a common load and/or bus. Electrochemical devices may include fuel cell stack segments, battery cells, electrolysis cells, electrochemical pumping cells (e.g., hydrogen separators), or any other device that may be monitored by EIS.

EIS enables the overall impedance of an electrochemical device to be determined by measuring a voltage or current across the electrochemical device at varying sampling frequencies. A testing waveform selected to achieve the varying sampling frequencies, such as a waveform with oscillations of approximately 1 Hz, may be generated on a line connected to the electrochemical device, for example by rapid switching of the line to load and unload the electrochemical device, thereby injecting the test waveform into the electrochemical device. The testing waveform may be a sine wave or other type wave selected to achieve desired sampling frequencies. A voltage or current and resulting phase angle of the electrochemical device may be determined at each of the sampling frequencies, and using EIS converted into impedances.

Results of the EIS procedure (e.g., the impedance at varying frequencies) may be graphically represented using a Nyquist plot or Bode plot and characteristics of the electrochemical device may be determined based on the impedance response of the electrochemical device. By comparing the impedance response of the electrochemical device being measured to known signatures of impedance responses of electrochemical devices with known characteristics, the characteristics of the measured device may be identified. Characteristics of the electrochemical device that may be determined based at least in part on the impedance response include fuel conditions (e.g., fuel utilization rate), air conditions (e.g., an air utilization rate), catalyst conditions (e.g., cracks in anode catalyst coatings), and water conditions (e.g., PEM fuel cell membrane water flooding). Based on the characteristics of the electrochemical device a setting of the electrochemical device may be adjusted. For example, based on the fuel utilization rate and/or water flow rate, a fuel flow and/or water flow into the fuel inlet stream setting for fuel provided to the electrochemical device may be adjusted. Additionally, determined characteristics of the electrochemical device may be compared to a failure threshold, and when the characteristics exceed the failure threshold, a failure mode of the electrochemical device may be indicated, such as a fuel starvation state, a catalyst poisoning state, or a water flooding state.

Figure 6:
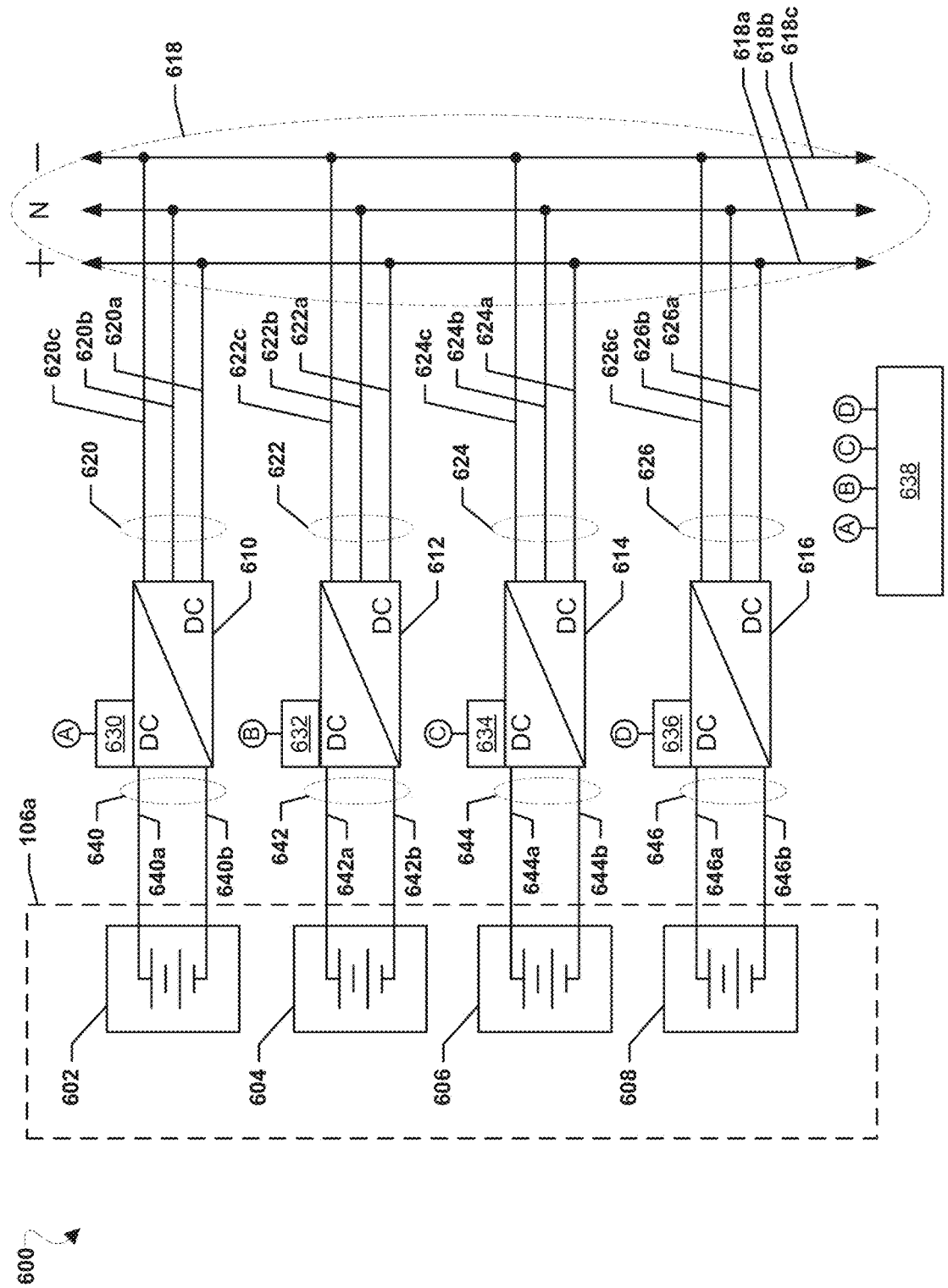
FIG. 6 is a block diagram of a system according to an embodiment.

FIG. 6 is a block diagram of a system 600 according to an embodiment. The system 600 may include four electrochemical devices 602, 604, 606, and 608. For example, the electrochemical devices 602, 604, 606, and 608 may each be a battery or a fuel cell stack segments of fuel cells which may constitute a portion 106*a* of power module 106. Any suitable battery may be used as an electrochemical device, as described herein. Examples include lithium ion batteries, aluminum ion batteries, nickel cadmium batteries, nickel zinc batteries, zinc ion batteries, polymer-based batteries, and alkaline batteries. Any battery suitable for a power system, particularly an uninterruptable power system or power backup system, may be used in embodiments disclosed herein.

Each electrochemical device 602, 604, 606, and 608 may be electrically connected via a respective input connection 640, 642, 644, and 646 to a respective one of power electronics 610, 612, 614, and 616. Each input connection 640, 642, 644, and 646 may comprise a respective positive input connection 640*a*, 642*a*, 644*a*, and 644*b* as well as a respective negative input connection 640*b*, 642*b*, 644*b*, and 646*b*. In operation, the electrochemical devices 602, 604, 606, and 608 may output DC voltages to their respective power electronics 610, 612, 614, and 616 via their respective input connections 640, 642, 644, and 646.

The power electronics 610, 612, 614, and 616 may be DC to DC converters, for example 380 volt 23 amp DC to DC converters. The power electronics 610, 612, 614, and 616 may be each include controllers 630, 632, 634, and 636, respectively, each connected, wired or wirelessly, to a central controller 638. The controllers 630, 632, 634, and 636 may include processors configured with processor-executable instructions to perform operations to control their respective power electronics 610, 612, 614, and 616, and the controller 638 may be a processor configured with processor-executable instructions to perform operations to exchange data with and control the operations of power electronics 610, 612, 614, and 616 via their respective controllers 630, 632, 634, and 636. Via the connections A, B, C, and D between the controllers 630, 632, 634, 636 connected to the power electronics 610, 612, 614, and 616 and controller 638, the controller 638 may be effectively connected to the power electronics 610, 612, 614, and 616 and control the operations of the power electronics 610, 612, 614, and 616.

The power electronics 610, 612, 614, and 616 may be connected in parallel to a DC bus 618 by their respective output connections 620, 622, 624, and 626. In an embodiment, the DC bus 618 may be a three phase bus comprised of a positive line 618*a*, a neutral line 618*b*, and a negative line 618*c*, and the respective output connections 620, 622, 624, and 626 may include respective positive output connections 620*a*, 622*a*, 624*a*, and 626*a*, respective neutral output connections 620*b*, 622*b*, 624*b*, and 626*b*, and respective negative output connections 620*c*, 622*c*, 624*c*, and 626*c*. In operation, the power electronics 610, 612, 614, and 616 may output DC voltages to the bus 618 via their respective output connections 620, 622, 624, and 626. In an embodiment, power electronics 610, 612, 614, and 616 may be three phase converters configured to receive positive and negative DC inputs from their respective electrochemical devices 602, 604, 606, and 608 and output positive DC, negative DC, and neutral outputs to the bus 618 via their respective positive output connections 620*a*, 622*a*, 624*a*, and 626*a*, respective neutral output connections 620*b*, 622*b*, 624*b*, and 626*b*, and respective negative output connections 620*c*, 622*c*, 624*c*, and 626*c*. In an alternative embodiment, power electronics 610, 612, 614, and 616 may each be comprised of dual two phase converters. The positive output of the first of the two phase converters may be connected to the positive line 618*a* of the bus 618 and the negative output of the second of the two phase converters may be connected to the negative line 618*c* of the bus 618. The negative output of the first of the two phase converters and the positive output of the second of the two phase converters may be connected together to the neutral line 618*b* of the bus 618.

In an embodiment, the power electronics 610, 612, 614, and 616 may each be configured to perform EIS monitoring of their respective electrochemical device 602, 604, 606, and 608. Controller 638 may select a test waveform for use in EIS monitoring for one of the electrochemical devices 602, 604, 606, or 608, and may control that power electronics 610, 612, 614, or 616 of that electrochemical device 602, 604, 606, or 608 to inject the selected test waveform onto the respective input connection 640, 642, 644, or 646. For example, the controller 638 may send an indication of the selected test waveform to the controller 630 of power electronics 610 to cause opening and closing of a switch at the power electronics 610 to generate the selected test waveform via pulse width modulation on the input connection 640 connected to the electrochemical device 602. The power electronics 610, 612, 614, or 616 injecting the test waveform may be configured to monitor the resulting impedance response of its respective electrochemical device 602, 604, 606, or 608, and via its respective controller 630, 632, 634, or 636 may output an indication of the monitored impedance response to the controller 638. Continuing with the preceding example, power electronics 610 may monitor the impedance response on the input connection 640 to the electrochemical device 602 and the controller 630 may indicate the impedance response of electrochemical device 602 to the controller 638.

Controller 638 may use the impedance response determined by EIS monitoring of an electrochemical device 602, 604, 606, 608 to determine a characteristic of that electrochemical device 602, 604, 606, 608 and may adjust a setting of the system 600 based on the determined characteristic. The controller 638 may compare the impedance response determined by EIS monitoring of an electrochemical device 602, 604, 606, 608, such as a plot of the impedance response and/or stored impedance values, to impedance responses stored in a memory, such as stored plots of impedance responses and/or stored impedance values, of similar electrochemical devices correlated with known characteristics. The controller 638 may compare the impedance response determined by EIS monitoring of an electrochemical device 602, 604, 606, 608 to the stored impedance responses in any manner to identify matches between the impedance responses determined by EIS monitoring of an electrochemical device 602, 604, 606, 608 and the stored impedance responses.

When the controller 638 determines a match (e.g., identically or within some predetermined variance value) between the impedance response determined by EIS monitoring of an electrochemical device 602, 604, 606, 608 and a stored impedance response, the controller 638 may determine the characteristic correlated with the stored impedance response to be the characteristic of the respective electrochemical device 602, 604, 606, 608.

For example, controller 638 may determine an impedance variance with frequency for a battery. In particular, higher battery impedance in the lower frequencies may indicate a sign of lower capacity and/or higher internal resistance. Controller 638 can also use EIS to measure other properties of a battery, including its state of charge (SoC), state of health (SoH), overall battery lifetime, and diagnose if the battery includes malfunctioning or underperforming cells.

In order to assess the battery's SoH, controller 638 may compare the impedance behavior measured by EIS for the battery against a known impedance profile for the battery when the battery is new or in proper working order. Comparing the measured impedance behavior via EIS against the known impedance profile for the battery may reveal problems such as diminished capacity, and narrow voltage output window, degradation current rating, an increase in internal impedance (which may indicate further problems with the battery such as degraded electrical connections, leaks, degradation of the of electrolytes, etc.). The impedance measurement may also show that the battery is reaching the end of its cycle life, e.g., by showing a relatively high impedance across all frequencies.

When a test waveform is injected on an input connection 640, 642, 644, or 646 by a respective power electronics 610, 612, 614, or 616 to perform EIS monitoring, a ripple on the respective output connection 620, 622, 624, or 626 may occur. If unaccounted for, the resulting ripple from the power electronics 610, 612, 614, or 616 performing EIS monitoring may cause an undesired ripple on the DC bus 618. To prevent a ripple on the DC bus 618, the ripple from the power electronics 610, 612, 614, or 616 performing EIS monitoring may be offset or canceled by other ripples injected into the DC bus 618. In an embodiment, the other ripples may be generated by one or more of the other power electronics 610, 612, 614, or 616 not performing EIS monitoring.

The ripples from one or more of the other power electronics 610, 612, 614, or 616 not performing EIS monitoring may be generated by controlling the one or more of the other power electronics 610, 612, 614, or 616 not performing EIS monitoring to inject an offset waveform into their respective input connections 640, 642, 644, or 646. The offset waveform or waveforms may be selected by the controller 638 such that the ripples on the respective output connections 620, 622, 624, or 626 generated in response to injecting the offset waveform or waveforms cancels the ripple caused by the power electronics 610, 612, 614, or 616 performing EIS monitoring when the waveforms are summed at the DC bus 618. In another embodiment, ripples may be injected into output connections 620, 622, 624, or 626 from devices other than the power electronics 610, 612, 614, or 616 to cancel the ripple caused by the power electronics 610, 612, 614, or 616 performing EIS monitoring when the waveforms are summed at the DC bus 618. For example, a waveform generator may be connected to output connections 620, 622, 624, or 626 to inject canceling ripples in response to EIS monitoring.

Figure 7A:
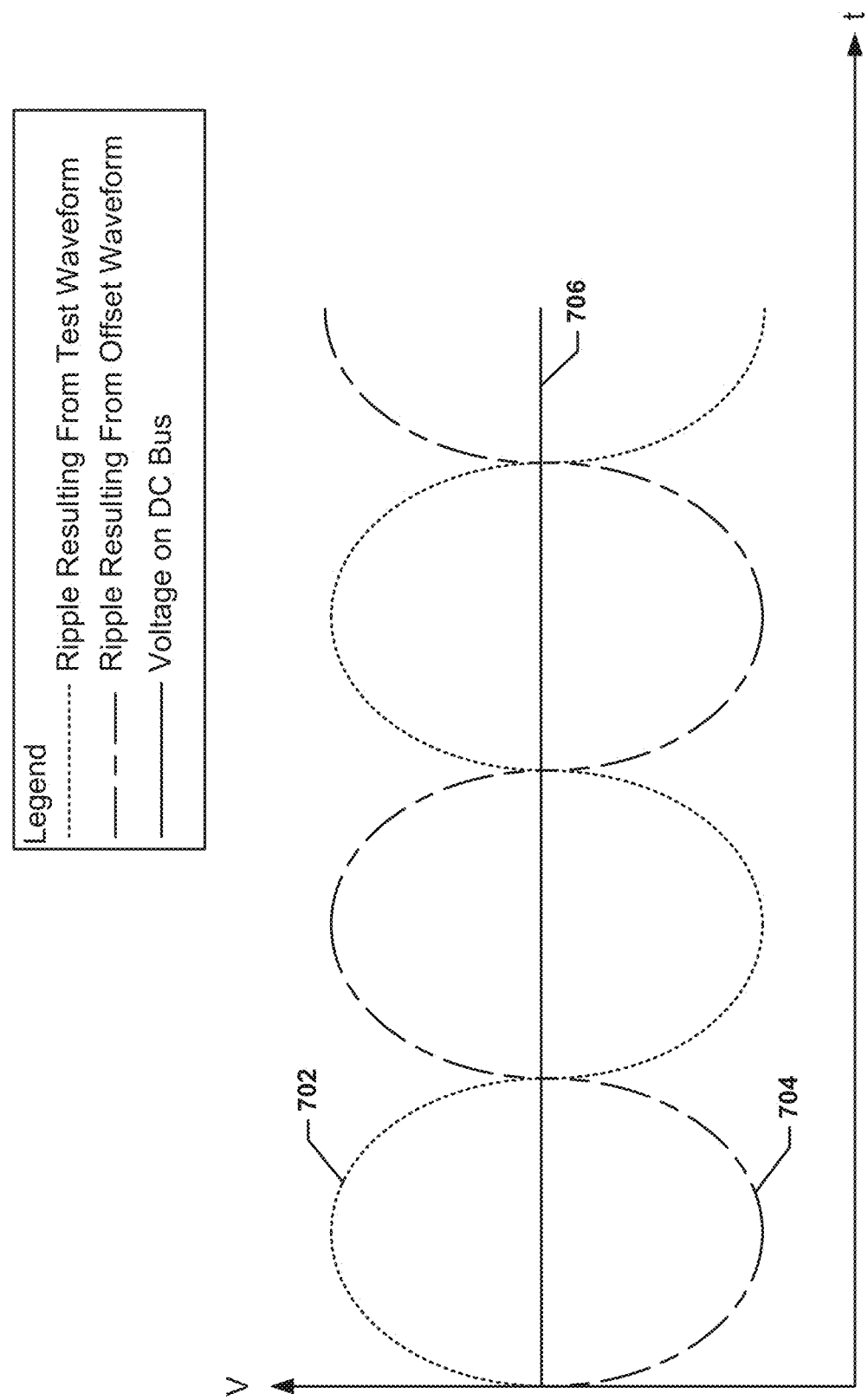
FIGS. 7A and 7B are graphs illustrating canceling ripples on a DC bus over time.

FIG. 7A is a graph illustrating canceling ripples on a DC bus over time. A test waveform injected onto an input connection of an electrochemical device by a power electronics may result in a ripple 702 sent from the power electronics injecting the test waveform toward a DC bus. An offset waveform injected onto an input connection of another electrochemical device by another power electronics may result in a ripple 704 sent from that power electronics injecting the offset waveform toward the DC bus. The offset waveform may be selected such that the ripple 704 is 180 degrees out of phase with the ripple 702. The power electronics may be connected to the DC bus in parallel and the sum of the ripple 702 and the ripple 704 may cancel each other out such that the sum of the waveforms is the desired DC voltage 706 on the DC bus.

Figure 7B:
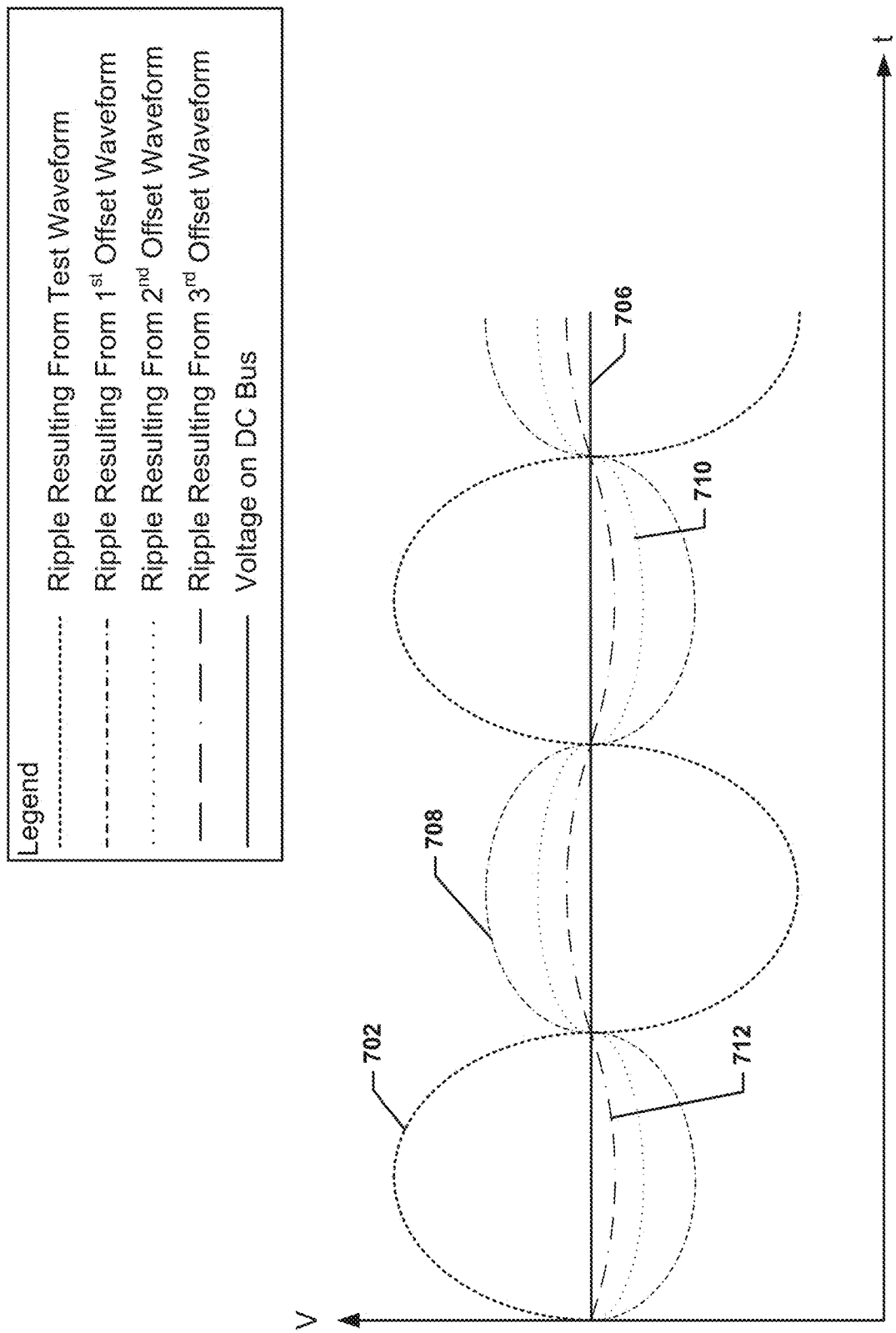

FIG. 7B is another graph illustrating canceling ripples on a DC bus over time using more than one offsetting waveform. As discussed above, a test waveform injected onto an input connection of an electrochemical device by a power electronics may result in a ripple 702 sent from the power electronics injecting the test waveform toward a DC bus.

Three other power electronics may be used to generate offset waveforms injected onto input connections of three other electrochemical devices. The first offset waveform injected onto an input connection of a first other electrochemical device by the first other power electronics may result in a ripple 708 sent from that first other power electronics injecting the offset waveform toward the DC bus. The second offset waveform injected onto an input connection of a second other electrochemical device by the second other power electronics may result in a ripple 710 sent from that second other power electronics injecting the offset waveform toward the DC bus. The third offset waveform injected onto an input connection of a third other electrochemical device by the third other power electronics may result in a ripple 712 sent from that third other power electronics injecting the offset waveform toward the DC bus. The three offset waveforms may be selected such that the sum of the ripples 708, 710, and 712 may cancel ripple 702 such that the sum of the waveforms is the desired DC voltage 706 on the DC bus. While illustrated in FIGS. 7A and 7B as one generated offsetting ripple 704 or three offsetting ripples 708, 710, 712 with the same frequency as the ripple 702, more or less offsetting ripples, with different waveforms, different frequencies, phases, amplitudes, etc. may be generated and injected toward the DC bus as long as the total of any offsetting ripples plus the ripple 702 sent from the power electronics injecting the test waveform toward the DC bus results in the desired DC voltage 706 on the DC bus with no ripple.

Figure 8:
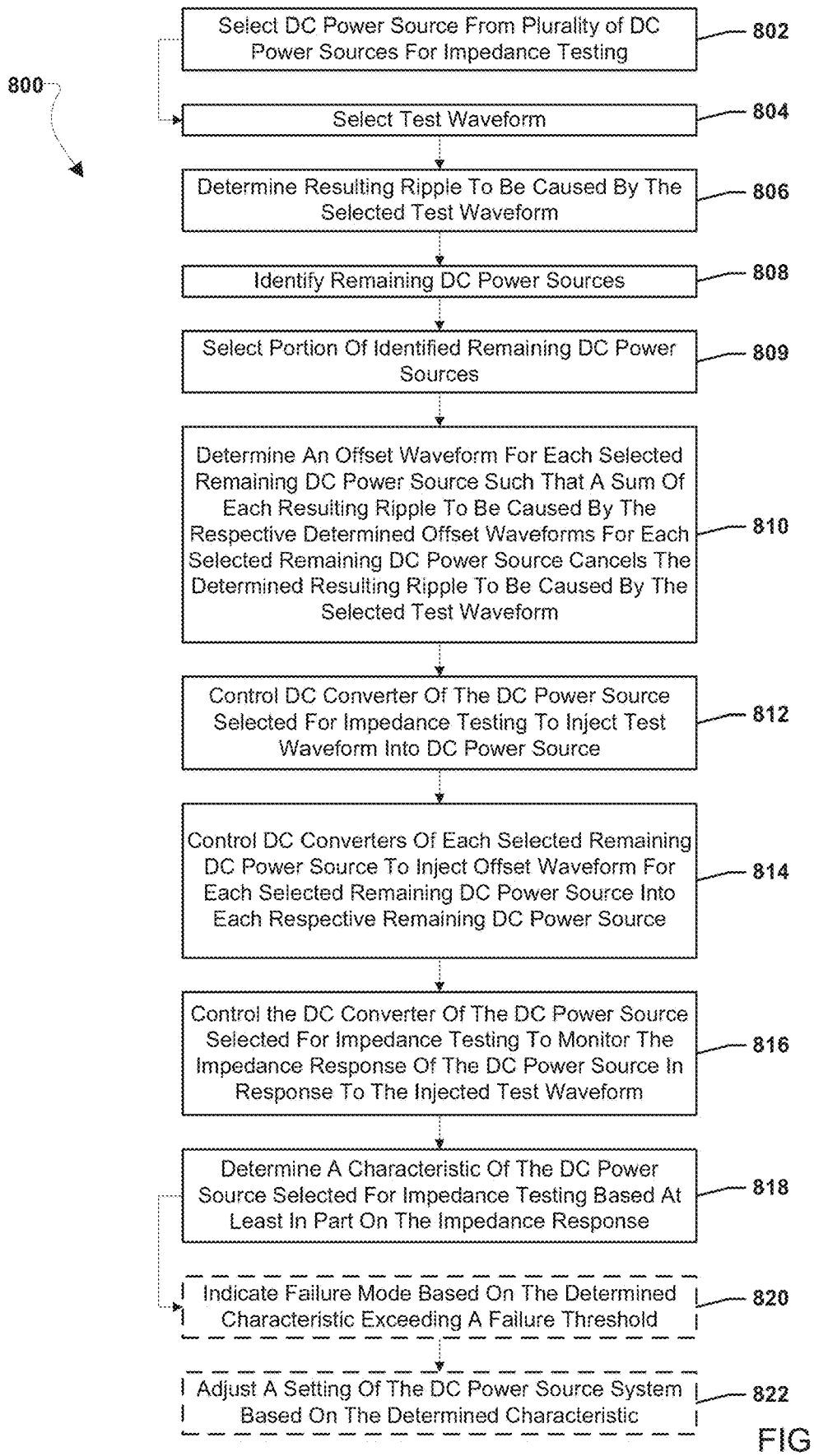
FIG. 8 is a process flow diagram illustrating an embodiment method for canceling the ripple to a DC bus caused by a test waveform.

FIG. 8 illustrates an embodiment method 800 for canceling the ripple to a DC bus caused by a test waveform using system 600. In an embodiment, the operations of method 800 may be performed by a controller, such as controller 638. The operations of method 800 are discussed in terms of batteries, fuel cell stack segments, and DC converters, but batteries, fuel cell stack segments, and converters are used merely as examples. Other electrochemical devices and/or other power electronics may be used in the various operations of method 800.

In block 802 the controller 638 may select an electrochemical device, such as a battery, from a plurality of electrochemical devices for impedance testing. For example, the electrochemical device may be selected based on a testing protocol governing when and in what order electrochemical devices may be tested. In block 804 the controller 638 may select a test waveform. The test waveform may selected to generate necessary oscillations for EIS monitoring, such as oscillations of approximately 1 Hz.

In block 806 the controller 638 may determine a resulting ripple to be caused by the selected test waveform. As discussed above, the resulting ripple may be the ripple output to the DC bus from the DC converter injecting the test waveform. In block 808 the controller 638 may identify the remaining electrochemical devices. The remaining electrochemical devices may include batteries, fuel cell stack segments, supercapacitors, etc. Alternatively, other remaining DC power sources, such as photovoltaic cells or thermoelectric generators, may be identified. The remaining electrochemical devices may be the electrochemical devices not selected for impedance testing. In block 810 the controller 638 may select a portion of the identified remaining electrochemical devices. In an embodiment, the selected portion may be all identified remaining batteries and fuel cell stack segments. In another embodiment, the selected portion may be less than all identified remaining batteries and fuel cell stack segments, such as only a single identified remaining fuel cell stack segment.

In block 810 the controller 638 may determine an offset waveform for each selected remaining fuel cell stack segment such that a sum of each resulting ripple to be caused by the respective determined offset waveforms for each selected remaining electrochemical devices cancels the determined resulting ripple to be caused by the selected test waveform. In an embodiment, each offset waveform may be generated such that the resulting ripple is the same, such as one, two, three or more equal ripples that together cancel the ripple from the test waveform. In another embodiment, each offset waveform may be generated such that the resulting ripples are different, such as two, three, or more different ripples that together cancel the ripple from the test waveform.

In block 812 the controller 638 may control the DC converter of the electrochemical device selected for impedance testing to inject the test waveform into the selected electrochemical device. For example, the controller 638 may send control signals to a controller (e.g., 630, 632, 634, or 636) of the DC converter to cause the converter to perform pulse width modulation to generate the test waveform on an input connection to the electrochemical device. In block 814 the controller 638 may control the DC converters of each selected remaining electrochemical device to inject the offset waveform for each selected remaining electrochemical devices into each respective electrochemical device. For example, the controller 638 may send control signals to the controllers (e.g., 630, 632, 634, and/or 636) of the DC converters to cause the converters to perform pulse width modulation to generate the offset waveforms on an input connection to their respective electrochemical devices. The operations of method 800 performed in blocks 812 and 814 may occur simultaneously, such that the test waveform and offset waveforms are injected at the same time resulting in ripples being output from the various DC converters that cancel each other out resulting in a the desired DC voltage on the DC bus.

In block 816 the controller 638 may control the DC converter of the DC power source selected for impedance testing to monitor the impedance response of the DC power source in response to the injected test waveform.

In block 818 the controller 638 may determine a characteristic of the electrochemical device selected for impedance testing based at least in part on the impedance response. As discussed above, the controller may use EIS monitoring to plot the real and imaginary parts of the measured impedances resulting from the injected test waveform and compare the plotted impedances to the known signatures of impedance responses of electrochemical devices with known characteristics. The known signatures of impedance responses of the electrochemical devices with known characteristics may be stored in a memory available to the controller. The stored known signatures of impedance responses of the electrochemical devices with known characteristics may be plots of the real and imaginary parts of the measured impedances of healthy fuel electrochemical devices and damaged/degraded electrochemical devices derived from testing healthy (i.e., undamaged/undegraded) and damaged/degraded electrochemical devices with various forms of damage (e.g., anode cracking of fuel cells) and/or degradation (e.g., degradation of the electrolyte of a fuel cell). The known characteristics may be correlated with the plots of the real and imaginary parts of the measured impedances stored in the memory. By matching the measured impedances to the known signatures of impedance responses, the current characteristics or state of the electrochemical device may be determined as those characteristics correlated with the matching known signature of impedance response.

In optional block 820 the controller 638 may indicate a failure mode based on the determined characteristic exceeding a failure threshold. For example, if the determined characteristic exceeds a failure threshold, then a failure mode may be indicated. For example, for a fuel cell, a failure mode may be a fuel starvation state, catalyst damage and/or poisoning state, or a water flooding. In optional block 822 the controller 638 may adjust a setting of the electrochemical device system based on the determined characteristic. For example, the controller 638 may adjust (e.g., increase or decrease) drawn current from electrochemical devices or shut off of the electrochemical devices based on the determined characteristic. In this manner, impedance testing, such as EIS monitoring, may be used in a fuel cell system to adjust the operation of the electrochemical device system based on current characteristics of the electrochemical devices.

Figure 9A:
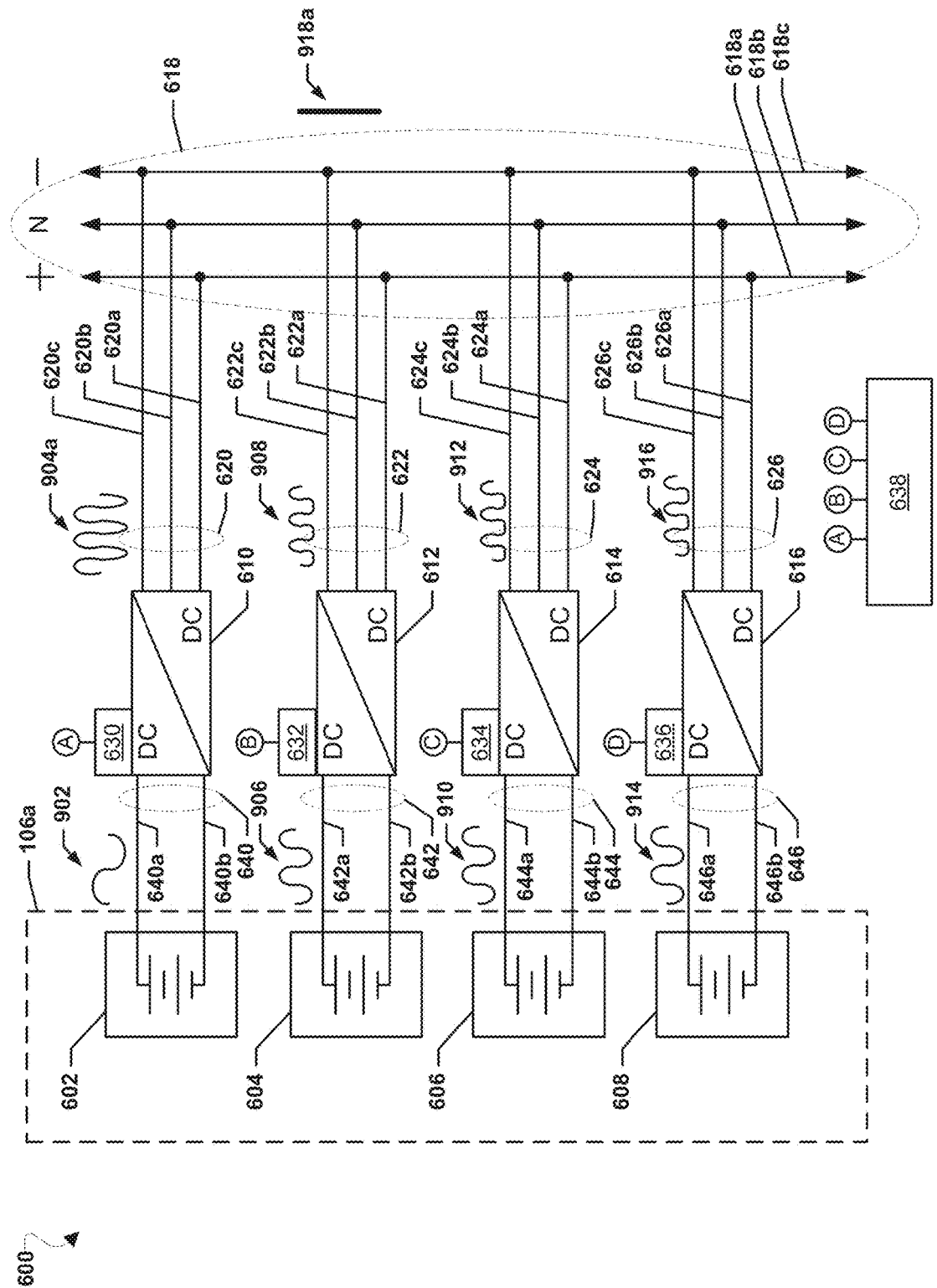
FIG. 9A is a block diagram of a system illustrating injected waveforms and resulting canceling ripples according to an embodiment.

FIG. 9A is a block diagram of the system 600 described above with reference to FIG. 6, illustrating injected waveforms 902, 906, 910, and 914 and resulting canceling ripples 904a, 908, 912, and 916 according to an embodiment. Note that FIG. 9A assumes that, if any DC power sources 602-608 are batteries, then the batteries are in a state of discharging rather than a charging state. The case in which an electrochemical device is charging is dealt below in the context of FIGS. 9C and 9D.

A test waveform 902 may be injected into the input connection 640 resulting in a test ripple 904a on the output connection 620 to the DC bus 618. An offset waveform 906 may be injected into the input connection 642 resulting in an offset ripple 908 on the output connection 622 to the DC bus 618. An offset waveform 910 may be injected into the input connection 644 resulting in an offset ripple 912 on the output connection 624 to the DC bus 618. An offset waveform 914 may be injected into the input connection 646 resulting in an offset ripple 916 on the output connection 626 to the DC bus 618. The sum of the ripples 904, 908, 912, and 916 may be such that steady DC voltage 918a without a ripple occurs on the DC bus 618 despite AC ripples occurring on the output connections 620, 622, 624, and 626. While the sum of the ripples 904, 908, 912, and 916 may be such that steady DC voltage 918a without a ripple results on the DC bus 618, the sum of the offset waveforms 906, 910, and 914 and the test waveform 902 need not equal zero. The offset ripples 908, 912, and 916 may all be the same or may be different. For example, offset ripple 908 may be a larger ripple than offset ripples 912 and 916. Additionally, whether or not the offset ripples 908, 912, and 916 are the same or different, the offset waveforms 906, 910, and 914 may not be the same. While three offset waveforms 906, 910, and 914 and their resulting offset ripples 908, 912, and 916 are illustrated, less offset waveforms and offset ripples, such as only two offset waveforms and resulting offset ripples or only one offset waveform and one resulting offset ripple, may be generated to offset the test ripple 904a. Alternatively, DC power sources 602, 604, 606, and 608 may also comprise non-electrochemical DC power sources, such as solar cells or thermoelectric devices. Each DC power source 602-608 has a separate, respective, dedicated power electronic device 610-616 which injects a waveform into the respective DC power source 602-608.

In one embodiment, each DC power source other than a fuel cell based power source contains a dedicated, separate, respective, DC/DC converter which injects either a test waveform or an offset waveform into the DC power source. The DC power source can be a battery, supercapacitor, photovoltaic cell or thermoelectric device in this embodiment. The test waveform causes a test ripple on the output connection from the DC/DC converter sending the test waveform. The offset waveform(s) cause(s) an offset or complimentary ripple on the output connection from the DC/DC converter(s) sending the offset waveform(s). The offset ripples offset and cancel the test ripple, while the complementary ripple(s) superimpose on the test ripple and increase the amplitude of the test ripple, as will be described below in more detail.

In an alternative embodiment, the offset ripples 908, 912, and/or 916 may be generated by other devices, such as waveform generators, connected to output connections 622, 624, and 626 and controlled by the controller 638, rather than the power electronics 612, 614, and/or 616. The offset ripples 908, 912, and/or 916 may be generated by the other devices such that the sum of the ripples 904a, 908, 912, and 916 may be the steady DC voltage 918a without a ripple on the DC bus 618. Additionally, combinations of ripples generated by the power electronics 612, 614, and/or 616 and the other devices, such as additional waveform generators, may be used to cancel the ripple 904a resulting in the steady DC voltage 918a without a ripple on the DC bus 618.

Figure 9B:
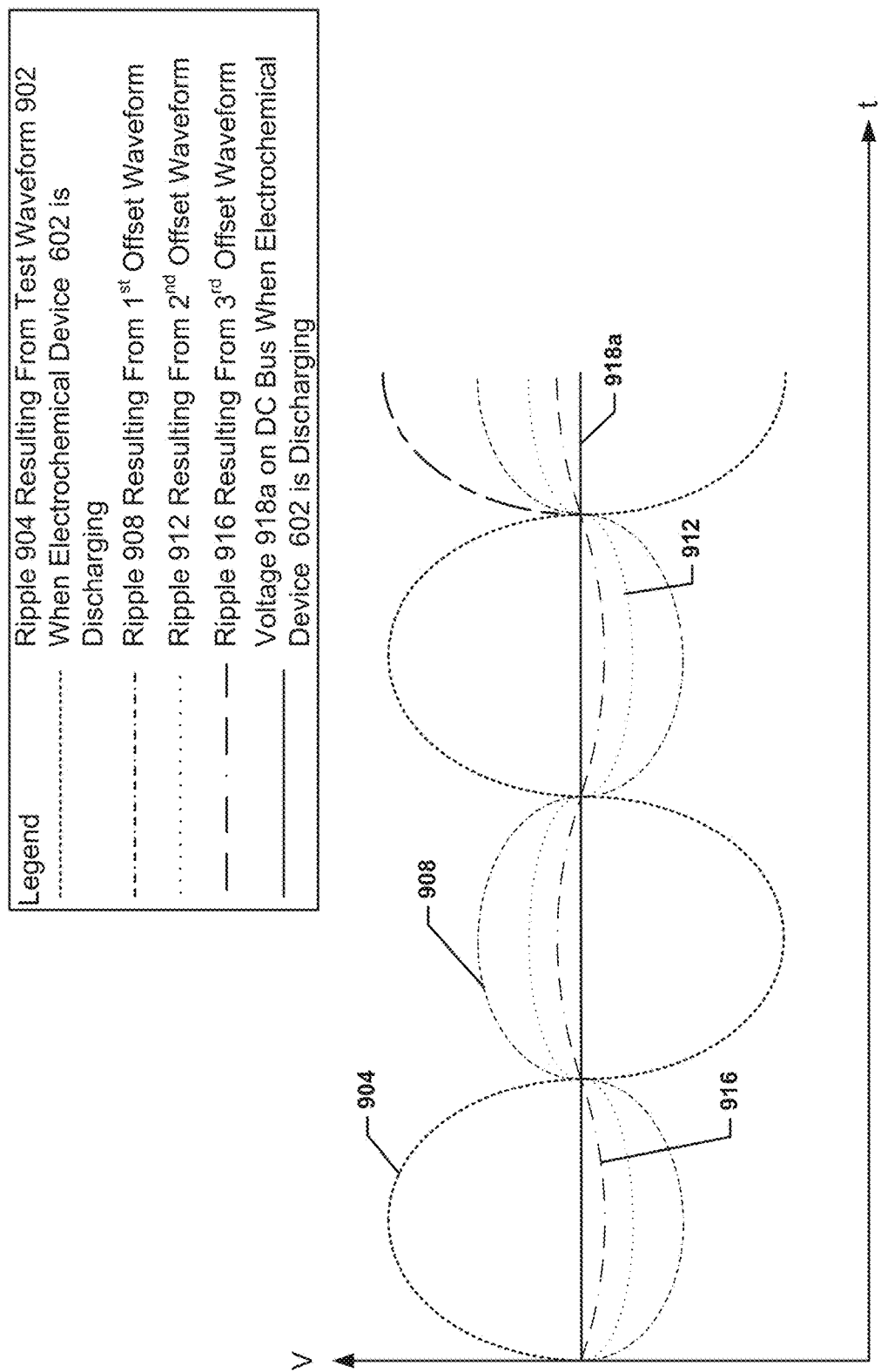
FIG. 9B is a graph illustrating canceling ripples on a DC bus over time using the waveforms shown in FIG. 9A when a tested electrochemical device is in discharge mode according to an embodiment.

FIG. 9B is a graph illustrating canceling ripples on a DC bus over time using the waveforms shown in FIG. 9A when the DC power source, such as an electrochemical device 602 is in discharge or power generation mode. As discussed above, test waveform 902 is injected by power electronics (e.g., DC/DC converter) 610 onto an input connection 640a to DC power source 602 resulting in test ripple 904a toward the DC bus 618.

Three other power electronics (e.g., DC/DC converter) 612, 614, and 616 generate offset waveforms 906, 910, and 914, respectively, injected onto input connections 642a, 644a, and 646a of three other DC power sources, such as electrochemical devices 604, 606, and 608. The first offset waveform 906 may result in a ripple 908 sent toward the DC bus. The second and third offset waveforms 910 and 914 may result in ripples 912 and 916, respectively, sent toward the DC bus 618. The three offset waveforms 906, 910, and 914 may be selected such that the sum of the ripples 908, 912, and 916 may cancel ripple 904a such that the sum of the waveforms is the desired DC voltage 918a on the DC bus with no ripple.

Figure 9C:
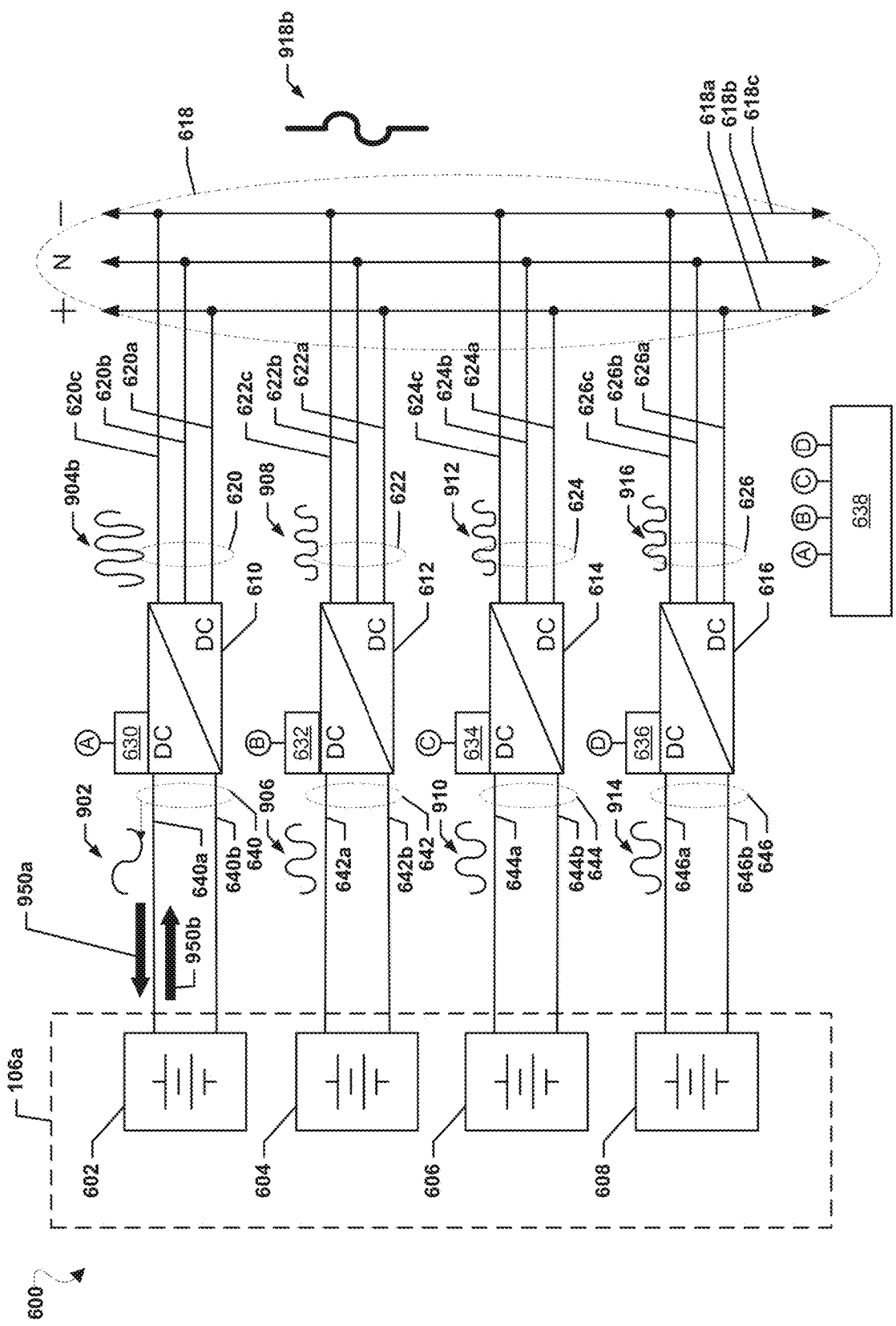
FIG. 9C shows a system when electrochemical impedance spectroscopy ("EIS") is used to detect a charging state of a battery according to an embodiment.

FIG. 9C shows system 600 when EIS is used to detect a charging state of a battery. More specifically, in FIG. 9C, DC power source 602 is an electrochemical energy storage device, such as a battery that may be in either a charging state or a discharging state. When electrochemical energy storage device 602 is in the charging state, current flows from DC/DC converter 610 to electrochemical device 602 via input connection 640a along the direction 950a. Conversely, when electrochemical energy storage device 602 is in the discharge state, current flows in the opposite direction 950b. As discussed above, FIGS. 9A and 9B show the result when electrochemical energy storage device 602 is in the discharge state.

The description of the functioning of system 600 when electrochemical energy storage device 602 is in the charging state is similar to the situation when the electrochemical energy storage device 602 is in the discharging state (i.e., the description in the context of FIG. 9A). Therefore, only the differences are described. Specifically, ripple 904b shown in FIG. 9C produced by providing test waveform 902 to electrochemical energy storage device 602 while in the charging state is in the opposite direction (i.e., 180 degrees out of phase) compared to the ripple 904a (FIG. 9A) produced by applying the same test waveform to 602 when discharging.

Despite that electrochemical energy storage device 602 is in charging mode, the controller 638 controls electrochemical devices 604, 606, and 608 to generate compensatory ripples 908, 912, and 916 for cancelling a ripple 904b generated based on test signal 902 when electrochemical energy storage device 602 is in charging mode. Therefore, as shown in FIG. 9C, compensatory ripples 908, 912, and 916 in charging mode are identical to the offset compensatory ripples 908, 912, and 916 in discharging mode (FIG. 9A). Such compensatory ripples 908, 912, and 916 may not cancel ripple 904b when the electrochemical energy storage device 602 is in charging mode. Therefore, detecting a (non-cancelled) voltage ripple 918b on DC bus 618 can be used as an indication that electrochemical energy storage device 602 is in charging mode. FIG. 9D explains in more detail how a non-cancelled voltage ripple 918c can indicate charging mode in the tested electrochemical energy storage device 602.

FIG. 9D is a graph illustrating non-canceling ripples on a DC bus over time using the waveforms shown in FIG. 9C when electrochemical energy storage device 602 is in charging mode. As discussed above, test waveform 902 is injected by power electronics 610 onto an input connection 640a to electrochemical energy storage device 602. This results in ripple 904b toward the DC bus 618.

Three other power electronics 612, 614, and 616 generate offset waveforms 906, 910, and 914, respectively, injected onto input connections 642a, 644a, and 646a of three other electrochemical devices 604, 606, and 608, e.g., fuel cell segments or other batteries. The first offset waveform 906 may result in a ripple 908 sent toward the DC bus. The second and third offset waveforms 910 and 914 may result in ripples 912 and 916, respectively, sent toward the DC bus 618. These three offset waveforms 906, 910, and 914 may be selected such that the sum of the ripples 908, 912, and 916 would cancel the ripple created by test waveform 902 when electrochemical energy storage device 602 is in discharge mode. When electrochemical energy storage device 602 is in charging mode, however, such compensatory ripples 908, 912, and 916 will not cancel ripple 904b. Instead, compensatory ripples 908, 912, and 916 will add to (i.e., superimpose on) ripple 904b when the ripples are in phase, as shown in FIG. 9D, to result in an increased amplitude of DC voltage ripple 918b on the DC bus. The increased amplitude of DC voltage ripple 918b on the DC bus can be taken as an indication that the tested electrochemical energy storage device 602 is operating in a discharge mode.

FIG. 9E compares the voltage ripple 918a on the DC bus when electrochemical energy storage device 602 is discharging to the voltage ripple 918b in which electrochemical energy storage device 602 is charging. As shown in FIG. 9E, the presence of ripple 918b is easily distinguished from the output voltage 918a which lacks a ripple and which occurs when compensatory ripples 908, 912, and 916 cancel a ripple 904a created when electrochemical energy storage device 602 is in charging mode. Therefore, the presence of the ripple at the DC bus 618 can be used as a means to distinguish between the state when the tested electrochemical energy storage device 602 is charging or discharging.

Figure 10:
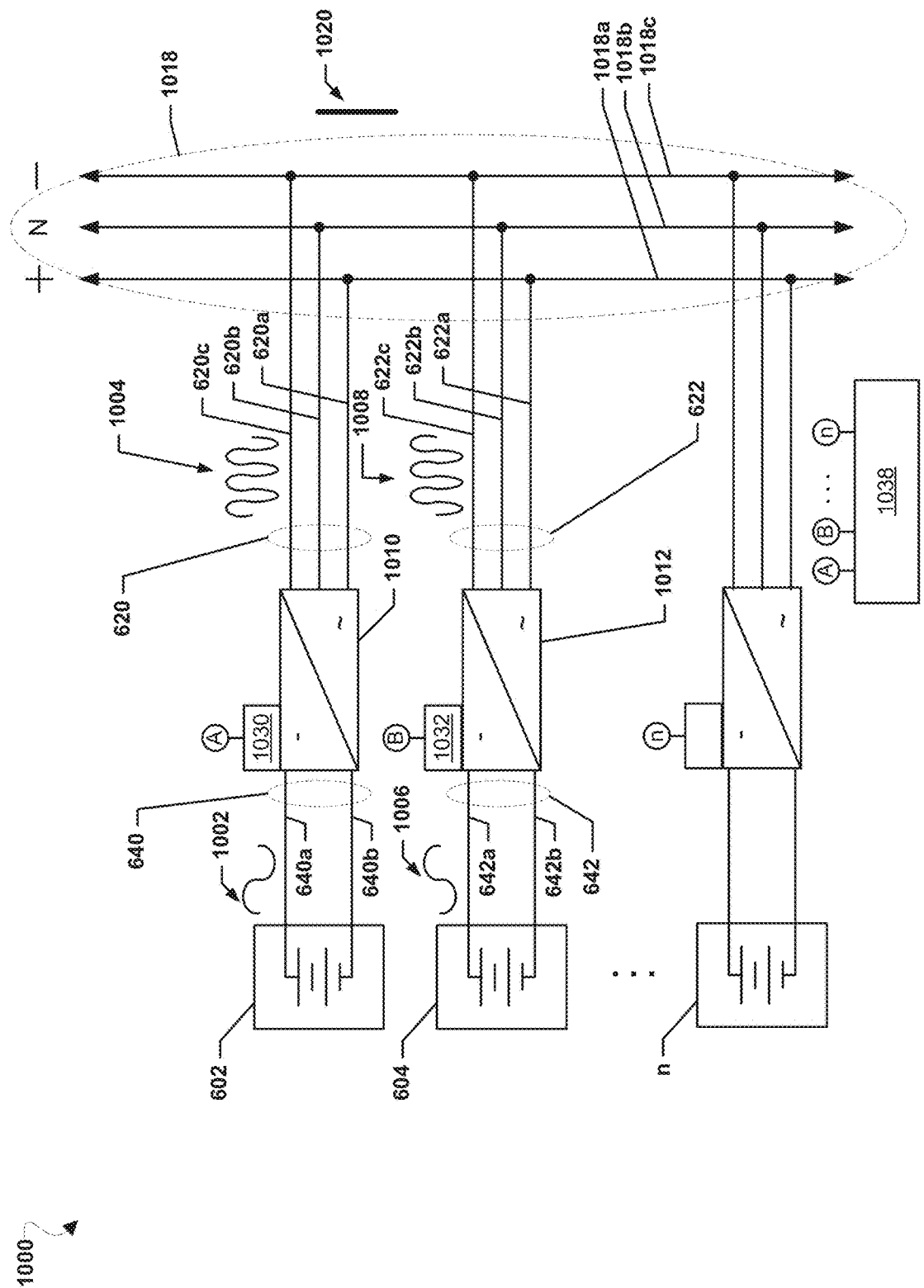
FIG. 10 is a block diagram of a system according to an embodiment.

FIG. 10 is a block diagram of a system 1000 according to an embodiment. FIG. 10 shows system 1000 including two DC power sources, such as electrochemical devices 602 and 604 as part of an array of "n" DC power sources. In the description that follows, merely for the purpose of illustration, only two DC power sources 602 and 604 are discussed. It is to be understood, however, that system 1000 may include any suitable number of DC power sources (e.g., the four electrochemical devices 602, 604, 606, and 608 and/or other DC power sources, e.g., solar cells or thermoelectric devices shown in FIG. 6). It is to be further understood that the various output ripples discussed below as being generated by the two DC power sources may vary according to the number of DC power sources.

As in system 600, DC power sources 602, 604 . . . n in system 1000 may each be a battery, supercapacitor, a fuel cell stack segments of fuel cells, photovoltaic cells, or thermoelectric devices which may constitute a portion 106a of power module 106. System 1000, however, provides the separate, dedicated inverters 1010 and 1012 for each DC power source 602, 604 . . . n. In addition, DC bus 618 is replaced by AC bus 1018. The DC/DC converters 610, 612 may be omitted or present in this embodiment.

DC power sources 602 and 604 in system 1000 may be electrically connected via a respective input connection 640 and 642 to a respective one of the inverters 1010 and 1012. Each input connection 640 and 642 may comprise a respective positive input connection 640a and 642a as well as a respective negative input connection 640b and 642b. In operation, the DC power sources 602 and 604 may output DC voltages to their respective inverters 1010 and 1012 via their respective input connections 640 and 642. Inverters 1010 and 1012 may then convert the DC output voltages to AC output and provide the AC output to AC bus 1018.

Inverters 1010 and 1012 may each include controllers 1030 and 1032 which are connected, wired or wirelessly, to central controller 1038. The controllers 1030 and 1032 may include processors configured with processor-executable instructions to perform operations to control their respective inverters 1010 and 1012, and the controller 1038 may be a processor configured with processor-executable instructions to perform operations to exchange data with and control the operations of inverters 1010 and 1012 via their respective controllers 1030 and 1032. Via the connections A and B between the controllers 1030 and 1032 connected to the inverters 1010 and 1012 and controller 1038, the controller 1038 may be effectively connected to the inverters 1010 and 1012, and control the operations of the inverters 1010 and 1012. The inverters 1010 and 1012 may be connected in parallel to the AC bus 1018 by their respective output connections 620 and 622. (e.g., AC buses).

In an embodiment, the AC bus 1018 may be a three phase bus comprised of a positive line 1018a, a neutral line 1018b, and a negative line 1018c, and the respective output connections 620 and 622, may include respective positive output connections 620a and 622a, respective neutral output connections 620b and 622b, and respective negative output connections 620c and 622c. Alternatively, the AC bus 1018 may be a single phase, two phase, or a four phase bus. In an embodiment, inverters 1010 and 1012 may be three phase inverters configured to receive positive and negative DC inputs from their respective DC power sources 602 and 604 and output positive AC, negative AC, and neutral outputs to the bus 1018 via their respective positive output connections 620a and 622a, respective neutral output connections 620b and 622b, and respective negative output connections 620c and 622c. In an alternative embodiment, inverters 1010 and 1012 may each be comprised of dual two phase inverters. The positive output of the first of the two phase inverters may be connected to the positive line 1018a of the bus 1018 and the negative output of the second of the two phase converters may be connected to the negative line 1018c of the bus 1018. The negative output of the first of the two phase inverters and the positive output of the second of the two phase inverters may be connected together to the neutral line 1018b of the bus 1018.

In an embodiment, the inverters 1010 and 1012 may each be configured to perform EIS monitoring of their respective DC power source 602 and 604. Controller 1038 may select a test waveform for use in EIS monitoring for one of the electrochemical devices 602 and 604, and may control the respective inverter 1010 and 1012 of that DC power source 602 and 604 to inject the selected test waveform onto the respective input connection 640 and 642. For example, the controller 1038 may send an indication of the selected test waveform to the controller 630 of inverter 1010 generate the selected test waveform 1002 via pulse width modulation on the input connection 640 connected to the DC power source 602. Inverter 1012 sends offset waveform 1006 to DC power source 604. The inverters 1010 and 1012 injecting the test waveform may be configured to monitor the resulting impedance response of its respective DC power source 602 and 604, and via its respective controller 630 and 632 may output an indication of the monitored impedance response to the controller 1038. Continuing with the preceding example, inverter 1010 may monitor the impedance response on the input connection 640 to the DC power source 602 and the controller 630 may indicate the impedance response of DC power source 602 to the controller 1038.

Controller 1038 may use the impedance response determined by EIS monitoring of an DC power source 602 or 604 to determine a characteristic of that DC power source 602 or 604 and may adjust a setting of the system 600 based on the determined characteristic. The controller 1038 may compare the impedance response determined by EIS monitoring of an DC power source 602 or 604, such as a plot of the impedance response and/or stored impedance values, to impedance responses stored in a memory, such as stored plots of impedance responses and/or stored impedance values, of similar electrochemical devices correlated with known characteristics. The controller 1038 may compare the impedance response determined by EIS monitoring of an DC power source 602 or 604 to the stored impedance responses in any manner to identify matches between the impedance responses determined by EIS monitoring of an DC power source 602 or 604 and the stored impedance responses.

When the controller 1038 determines a match (e.g., identically or within some predetermined variance value) between the impedance response determined by EIS monitoring of a DC power source 602 or 604 and a stored impedance response, the controller 1038 may determine the characteristic correlated with the stored impedance response to be the characteristic of the respective DC power source 602 or 604. Several examples are summarized above in the context of FIG. 6.

When a test waveform is injected on an input connection 640 or 642 by a respective inverter 1010 or 1012 to perform EIS monitoring, a ripple on the respective output connection 620 or 622 may occur. If unaccounted for, the resulting ripple from the power electronics 610 or 612 performing EIS monitoring may cause an undesired ripple on the AC bus 1018. To prevent a ripple on the AC bus 1018, the ripple from the inverter 1010 or 1012 performing EIS monitoring may be offset or canceled by other ripples injected into the AC bus 1018. In an embodiment, the other ripples may be generated by the inverter 1010 or 1012 not performing EIS monitoring. The ripples from one or more of the other inverter 1010 or 1012 not performing EIS monitoring may be generated by controlling the inverter 1010 or 1012 not performing EIS monitoring to inject an offset waveform into their respective input connections to their respective input connections 640 or 642. The offset waveform or waveforms may be selected by the controller 1038 such that the ripples on the respective output connections 620 or 622 generated in response to injecting the offset waveform or waveforms cancels the ripple caused by the inverter 1010 or 1012 performing EIS monitoring when the waveforms are summed at the AC bus 1018. In another embodiment, ripples may be injected into output connections 620 or 622 from devices other than the inverters 1010 or 1012 to cancel the ripple caused by the inverters 1010 or 1012 performing EIS monitoring when the waveforms are summed at the AC bus 1018. For example, a waveform generator may be connected to output connections 620 or 622 to inject canceling ripples in response to EIS monitoring.

FIG. 10 shows an exemplary test waveform 1002 that may be injected into the input connection 640 resulting in a ripple 1004 on the output connection 620 to the AC bus 1018. An offset waveform 1006 may be injected into the input connection 642 by the inverter 612 not performing EIS monitoring resulting in an offset ripple 1008 on the output connection 622 to the AC bus 1018. The sum of the ripples 1004 and 1008 may be such that an AC voltage 1020 without a ripple occurs on the AC bus 1018 despite AC ripples 1004 and 1008 occurring on the output connections 620 and 622, respectively.

While FIG. 10 shows inverter 1012 providing a single, offset (i.e., compensating) ripple 1006 in order to cause a net AC voltage 1020 without a ripple, it is to be understood that any combination of inverters in system 1000 may be used to compensate for ripple 1002. For example, if system 1000 has a total of four DC power sources (e.g., similar to system 600 shown in FIG. 9A), then three of the four inverters may be used to compensate for ripple 1002. Using any other suitable combination of inverters in the system to generate offset ripples is within the scope of the embodiments.

Figure 11:
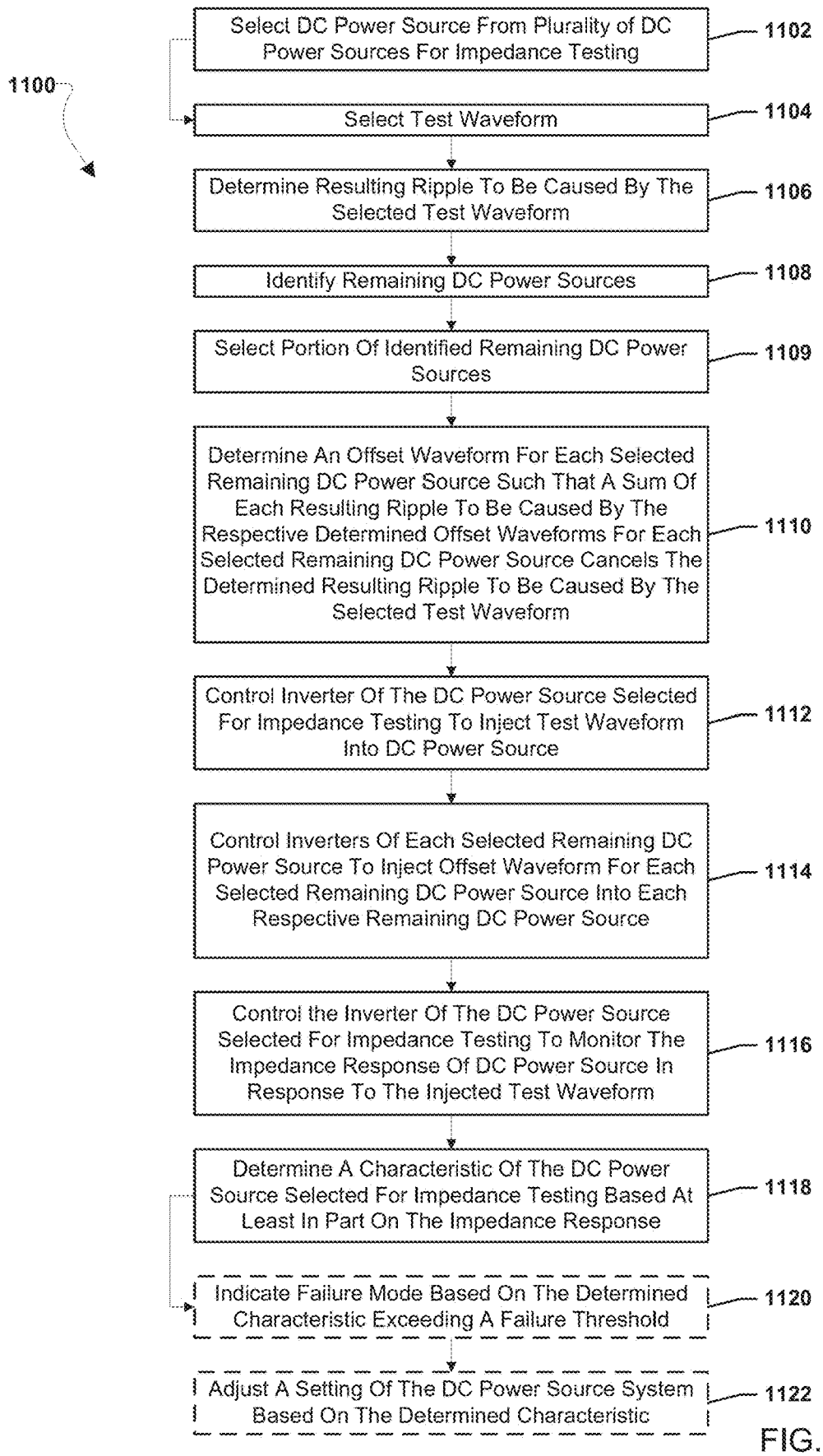
FIG. 11 illustrates an embodiment method for canceling the ripple to an AC bus caused by a test waveform using the system shown in FIG. 10 according to an embodiment.

FIG. 11 illustrates an embodiment method 1100 for canceling the ripple to an AC bus caused by a test waveform using system 1000. In an embodiment, the operations of method 1100 may be performed by a controller, such as controller 1038.

In block 1102 the controller 1038 may select device DC power source, such as a battery or fuel cell segment, from a plurality of DC power sources for impedance testing. For example, the DC power source may be selected based on a testing protocol governing when and in what order DC power sources may be tested. In block 1104 the controller 1038 may select a test waveform. The test waveform may selected to generate necessary oscillations for EIS monitoring, such as oscillations of approximately 1 Hz.

In block 1106 the controller 1038 may determine a resulting ripple to be caused by the selected test waveform.

As discussed above, the resulting ripple may be the ripple output to the AC bus from the inverter injecting the test waveform. In block 1108 the controller 1038 may identify the remaining DC power sources. The remaining DC power sources may include batteries, fuel cell stack segments, photovoltaic cells, thermoelectric generators, etc. The remaining DC power sources may be the DC power sources not selected for impedance testing. In block 1110 the controller 1038 may select a portion of the identified remaining electrochemical devices. In an embodiment, the selected portion may be all identified remaining DC power sources. In another embodiment, the selected portion may be less than all identified remaining DC power sources, such as only a single identified remaining DC power source.

In block 1110 the controller 1038 may determine an offset waveform for each selected remaining DC power source such that a sum of each resulting ripple to be caused by the respective determined offset waveforms for each selected remaining DC power sources cancels the determined resulting ripple to be caused by the selected test waveform. In an embodiment, each offset waveform may be generated such that the resulting ripple is the same, such as one, two, three or more equal ripples that together cancel the ripple from the test waveform. In another embodiment, each offset waveform may be generated such that the resulting ripples are different, such as two, three, or more different ripples that together cancel the ripple from the test waveform.

In block 1112 the controller 1038 may control the inverter of the DC power source selected for impedance testing to inject the test waveform into the selected DC power source. For example, the controller 1038 may send control signals to a controller (e.g., 1030) of the inverter to cause the inverter to perform pulse width modulation to generate the test waveform on an input connection to its respective DC power source 102. In block 1114 the controller 1038 may control the inverters of each selected remaining DC power source 102 to inject the offset waveform (e.g., 1032) into each respective DC power source 604. For example, the controller 1038 may send control signals to the controllers (e.g., 630 or 632) of the inverters to cause the inverters 1030, 1032 to perform pulse width modulation to generate the offset waveforms on an input connection to their respective DC power source. The operations of method 1100 performed in blocks 1112 and 1114 may occur simultaneously, such that the test waveform 1002 and offset waveforms 1006 are injected at the same time resulting in ripples 1004, 1008 that cancel each other out being output from the various inverters resulting in the desired AC voltage 1020 on the AC bus 1018.

In block 1118 the controller 1038 may determine a characteristic of the DC power source 602 selected for impedance testing based at least in part on the impedance response. As discussed above, the controller may use EIS monitoring to plot the real and imaginary parts of the measured impedances resulting from the injected test waveform and compare the plotted impedances to the known signatures of impedance responses of electrochemical devices with known characteristics. The known signatures of impedance responses of the electrochemical devices with known characteristics may be stored in a memory available to the controller. The stored known signatures of impedance responses of the DC power sources with known characteristics may be plots of the real and imaginary parts of the measured impedances of healthy DC power sources and damaged/degraded DC power sources derived from testing healthy (i.e., undamaged/undegraded) and damaged/degraded DC power sources with various forms of damage (e.g., anode cracking for fuel cell systems) and/or degradation (e.g., degradation of the electrolyte for fuel cell systems). The known characteristics may be correlated with the plots of the real and imaginary parts of the measured impedances stored in the memory. By matching the measured impedances to the known signatures of impedance responses, the current characteristics or state of the DC power source may be determined as those characteristics correlated with the matching known signature of impedance response.

In optional block 1120 the controller 1038 may indicate a failure mode based on the determined characteristic exceeding a failure threshold of the DC power source, that a failure mode may be indicated. In optional block 1122 the controller 1038 may adjust a setting of the DC power source system based on the determined characteristic. For example, the controller 1038 may adjust (e.g., increase or decrease) drawn current from DC power sources or shut off of the DC power sources based on the determined characteristic. In this manner, impedance testing, such as EIS monitoring, may be used to adjust the operation of the DC power source system based on current characteristics of the DC power source using dedicated inverters for each DC power source.

Figure 12:
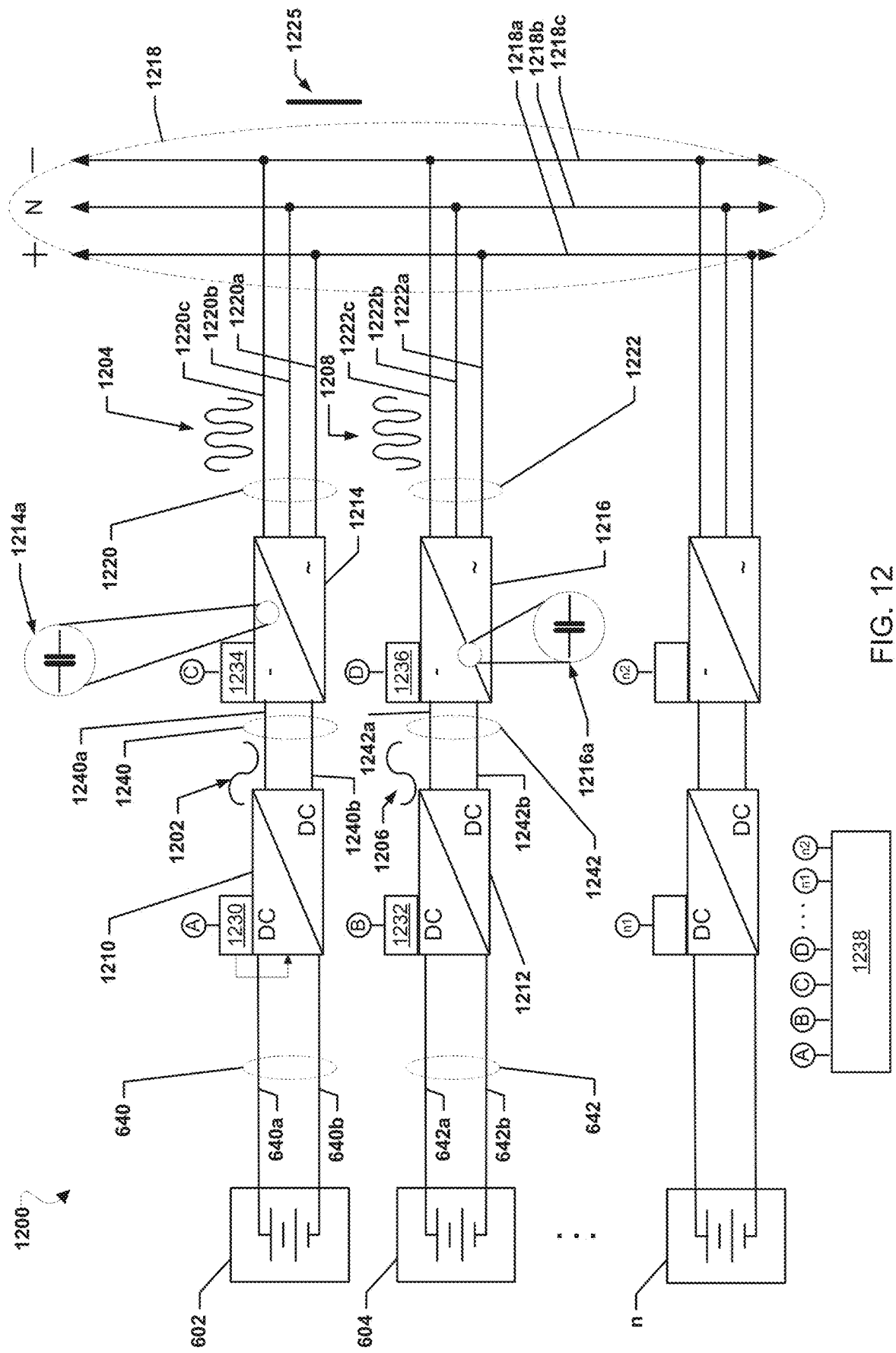
FIG. 12 is a block diagram of a system according to an embodiment.

FIG. 12 is a block diagram of a system 1200 according to an embodiment. FIG. 12 shows system 1200 including two DC power source, such as electrochemical devices 602 and 604 as part of an array of "n" DC power sources. In the description that follows, merely for the purpose of illustration, only DC power sources 602 and 604 are discussed. It is to be understood, however, that system 1200 may include any suitable number of DC power sources (e.g., the four DC power sources 602, 604, 606, and 608 shown in FIG. 6). It is to be further understood that the various output ripples discussed below as being generated by the electrical devices e.g., DC/DC converters may vary according to the number of DC power sources.

DC power sources 602 and 604 in system 1200 may be electrically connected via a respective input connection 640 and 642 to a respective one of DC/DC converters 1210 and 1212. Each input connection 640 and 642 may comprise a respective positive input connection 640a and 642a as well as a respective negative input connection 640b and 642b. In operation, the DC power sources 602 and 604 may output DC voltages to their respective DC/DC converters 1210 and 1212 via their respective input connections 640 and 642. DC/DC converters 1210 and 1212 may be connected to inverters 1214 and 1216 via connections 1240 and 1242. Each connection 1240 and 1242 may comprise a respective positive input connection 1240a and 1242a as well as a respective negative input connection 1240b and 1242b. In operation, DC/DC converters 1210 and 1212 may output DC voltages to their respective inverters 1214 and 1216 via their respective connections 1240 and 1242.

Note that while FIG. 12 shows each DC/DC converter 1210 and 1212 connected individually to different inverters 1214 and 1216, it is to be understood that this configuration is merely exemplary. Other configurations are within the scope of the embodiments. For example, system 1200 may include only a single inverter 1214 with each DC/DC converter connected to the single inverter 1214. A number of other suitable configurations are possible, including a configuration, for example, in which groups of DC/DC converters share the same inverter.

The inverters 1214 and 1216 may be connected in parallel to the AC bus 1218 by their respective output connections 1220 and 1222. In an embodiment, the AC bus 1218 may be a three phase bus comprised of a positive line 1218a, a neutral line 1218b, and a negative line 1218c, and the respective output connections 1220 and 1222, may include respective positive output connections 1220a and 1222a, respective neutral output connections 1220b and 1222b, and respective negative output connections 1220c and 1222c. In an embodiment, inverters 1214 and 1216 may be three phase inverters configured to receive positive and negative DC inputs from their respective DC/DC converters 1210 and 1212 and output positive AC, negative AC, and neutral outputs to the bus 1218 via their respective positive output connections 1220a and 1222a, respective neutral output connections 1220b and 1222b, and respective negative output connections 1220c and 1222c. In an alternative embodiment, inverters 1214 and 1216 may each be comprised of dual two phase inverters. The positive output of the first of the two phase inverters may be connected to the positive line 1218a of the bus 1218 and the negative output of the second of the two phase converters may be connected to the negative line 1218c of the bus 1218. The negative output of the first of the two phase inverters and the positive output of the second of the two phase inverters may be connected together to the neutral line 1218b of the bus 1218. One phase or phase inverters may also be used.

The DC/DC converters 1210 and 1212, may each include controllers 1230 and 1232, each controller connected, wired or wirelessly, to central controller 1238. Similarly, inverters 1214 and 1216 may each include controllers 1234 and 1236, also connected, wired or wirelessly, to central controller 1238. The controllers 1230, 1232, 1234, and 1236 may include processors configured with processor-executable instructions to perform operations to control their respective DC/DC converters 1210 and 1212 and inverters 1214 and 1216, and the controller 1238 may be a processor configured with processor-executable instructions to perform operations to exchange data with and control the operations of DC/DC converters 1210 and 1212 and inverters 1214 and 1216 via their respective controllers 1230, 1232, 1234, and 1236. The controller 1238 may be effectively connected DC/DC converters 1210 and 1212, and control the operations of the DC/DC converters 1210 and 1212 via the connections A and B between the controllers 1230 and 1232 connected to DC/DC converters 1210 and 1212 and controller 1238. Similarly The controller 1238 may be effectively connected inverters 1214 and 1216, and control the operations of inverters 1214 and 1216 via the connections C and D between the controllers 1234 and 1236 connected to inverters 1214 and 1216 and controller 1238.

In an embodiment, DC/DC converters 1210 and 1212 may each be configured to perform EIS monitoring of their respective inverters 1214 and 1216. In particular, DC/DC converters 1210 and 1212 may use EIS to perform impedance testing of capacitors 1214a and 1216a included in inverters 1214 and 1216, respectively, and shown in the insets in FIG. 12. Capacitors 1214a and 1216a may be representative of the effective capacitance of multiple components in inverters 1214 and 1216, respectively, rather than single component capacitors.

Controller 1238 may select a test waveform for use in EIS monitoring for one of the inverters 1214 and 1216, and may control DC/DC converters 1210 and 1212 to inject the selected test waveform onto the respective inverter 1214 and 1216, in particular for testing at least one of capacitors 1214a or 1216a. For example, the controller 1238 may send an indication of the selected test waveform to the controller 1230 of DC/DC converter 1210 to cause opening and closing of a switch at the DC/DC converters 1210 to generate the selected test waveform via pulse width modulation on the input connection 1240 connected to the inverter 1214. DC/DC converters 1210 and 1212 injecting the test waveform may be configured to monitor the resulting impedance response of its respective inverter 1214 and 1216, and via its respective controller 1230 or 1232 may output an indication of the monitored impedance response to the controller 1238. Continuing with the preceding example, DC/DC converter 1210 may monitor the impedance response on the input connection 1240 to the inverter 1214 and the controller 1230 may indicate the impedance response of inverter 1214 to the controller 1238. In particular, the impedance response may be indicative of an operational state of capacitor 1214a and/or 1216a. Such an operational state may include, for example, a capacitance range related to the overall functioning of the respective inverter 1214 or 1216.

Controller 1238 may use the impedance response determined by EIS monitoring of an inverter 1214 or 1216 to determine a characteristic of that inverter 1214 or 1216, or capacitor 1214a or 1216a located in the respective inverter, and may adjust a setting of the system 1200 based on the determined characteristic. The controller 1238 may compare the impedance response determined by EIS monitoring of an inverter 1214 or 1216, such as a plot of the impedance response and/or stored impedance values, to impedance responses stored in a memory, such as stored plots of impedance responses and/or stored impedance values, of similar electrochemical devices correlated with known characteristics. The controller 1238 may compare the impedance response determined by EIS monitoring of an inverter 1214 or 1216, or capacitor 1214a or 1216a located in the respective inverter, to the stored impedance responses in any manner to identify matches between the impedance responses determined by EIS monitoring of an inverter 1214 or 1216 and the stored impedance responses. One example of a stored response for comparison would be comparing the measured response to a stored response of a capacitor in a properly functioning inverter.

When the controller 1238 determines a match (e.g., identically or within some predetermined variance value) between the impedance response determined by EIS monitoring of an inverter 1214 or 1216, or capacitor 1214a or 1216a located in the respective inverter, and a stored impedance response, the controller 1238 may determine the characteristic correlated with the stored impedance response to be the characteristic of the respective inverter 1214 or 1216, or capacitor 1214a or 1216a located in the respective inverter. The specific EIS measurements are known. Several examples are summarized above in the context of FIG. 6.

When a test waveform is injected on an input connection 1240 or 1242 by a respective DC/DC converter 1210 or 1212 to perform EIS monitoring, a ripple on the respective output connection 1220 or 1222 may occur. If unaccounted for, the resulting ripple from the DC/DC converter 1210 or 1212 performing EIS monitoring may cause an undesired ripple on the AC bus 1218. To prevent a ripple on the AC bus 1218, the ripple from the DC/DC converter 1210 or 1212 performing EIS monitoring may be offset or canceled by other ripples injected into the AC bus 1218. In an embodiment, the other ripples may be generated by the DC/DC converter 1210 or 1212 not performing EIS monitoring. The ripples from one or more of the other DC/DC converter 1210 or 1212 not performing EIS monitoring may be generated by controlling the DC/DC converter 1210 or 1212 not performing EIS monitoring to inject an offset waveform into their respective input connections to their respective input connections 1240 or 1242. The offset waveform or waveforms may be selected by the controller 1238 such that the ripples on the respective output connections 1220 or 1222 generated in response to injecting the offset waveform or waveforms cancels the ripple caused by the DC/DC converter 1210 or 1212 performing EIS monitoring when the waveforms are summed at the AC bus 1218. In another embodiment, ripples may be injected into output connections 1220 or 1222 from devices other than the DC/DC converter 1210 or 1212 to cancel the ripple caused by the DC/DC converter 1210 or 1212 performing EIS monitoring when the waveforms are summed at the AC bus 1218. For example, a waveform generator may be connected to output connections 1220 or 1222 to inject canceling ripples in response to EIS monitoring.

FIG. 12 shows an exemplary test waveform 1202 that may be injected into the input connection 1240 resulting in a ripple 1204 on the output connection 1220 to the AC bus 1218. An offset waveform 1206 may be injected into the input connection 1242 resulting in an offset ripple 1208 on the output connection 1222 to the AC bus 1218. The sum of the ripples 1204 and 1208 may be such that an AC voltage 1225 without a ripple occurs on the AC bus 1218 despite AC ripples 1204 and 1208 occurring on the output connections 1220 and 1222, respectively.

While FIG. 12 shows DC/DC converter 1212 providing a single offset waveform 1206 in order to cause a net AC voltage 1225 without a ripple, it is to be understood that any combination of DC/DC converters in system 1200 may be used to compensate for ripple 1204. For example, if system 1200 has a total of four DC power source (e.g., such as system 600 shown in FIG. 9A), then three of the four DC/DC converters may be used to compensate for ripple 1204. Using any other suitable combination of inverters in the system to generate offset ripples is within the scope of the embodiments.

Figure 13:
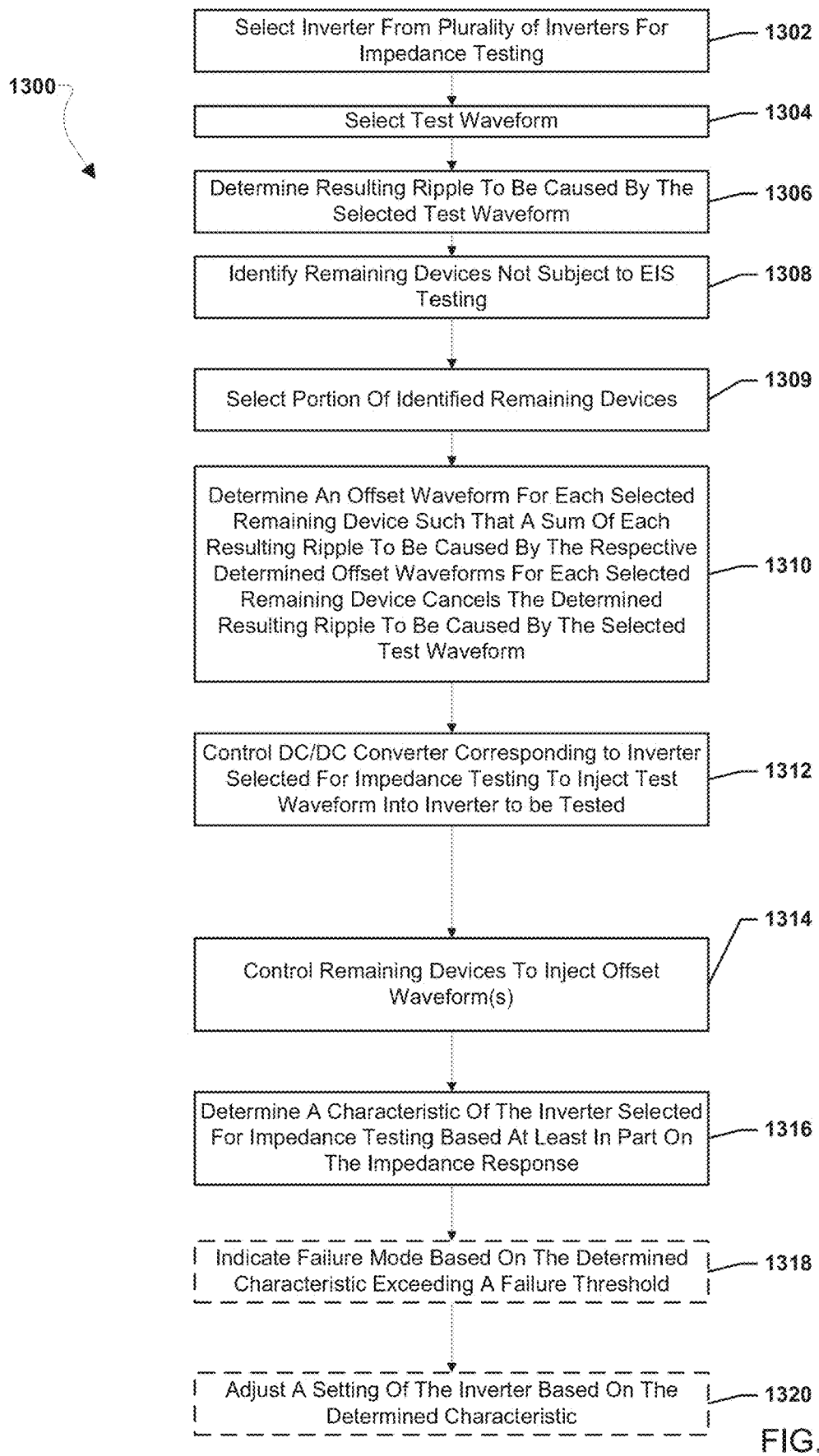
FIG. 13 illustrates an embodiment method 1300 for canceling the ripple to an AC bus caused by a test waveform using the system of FIG. 12 according to an embodiment.

FIG. 13 illustrates an embodiment method 1300 for EIS testing of a capacitor in an inverter and canceling the ripple to an AC bus caused by a test waveform using system 1200. In an embodiment, the operations of method 1300 may be performed by a controller, such as controller 1238. The operations of method 1300 are discussed in terms of inverters, capacitors, batteries, and fuel cell stack segments, but inverters, capacitors, batteries, and fuel cell stack segments are used merely as examples. Other electrochemical devices and/or other power electronics may be used in the various operations of method 1300.

In block 1302 the controller 1238 may select an inverter, from a plurality of inverters, for impedance testing. For example, the inverter may be selected based on a testing protocol governing when and in what order inverters may be tested. The inverter for testing may also be selected based on indications that capacitors within the inverter are malfunctioning or are in need of diagnostic (e.g., based on a predicted lifetime for the capacitor, etc.). Still other ways of selecting the inverter for testing include obtaining a measured response indicative of inverter malfunction (e.g., unexpected variations in output voltage or current).

In block 1304 the controller 1238 may select a test waveform. The test waveform may selected to generate necessary oscillations for EIS monitoring, such as oscillations of approximately 1 Hz. The test wave form is to be provided to the inverter via its respective DC/DC converter, for example provided to inverter 1214 via its adjacent DC/DC converter 1210, as shown in FIG. 12.

In block 1306 the controller 1238 may determine a resulting ripple to be caused by the selected test waveform. As discussed above, the resulting ripple may be the ripple output to the AC bus from the inverter into which the test waveform was injected. In block 1308 the controller 1238 may identify the remaining devices not subject to testing. These remaining devices may include inverters and DC/DC converters not subject to EIS testing. The remaining devices may also include other devices, e.g., capacitors, supercapacitors, batteries, and fuel cell stack segments. In block 1309 the controller 1238 may select a portion of the identified remaining devices. In an embodiment, the selected portion may be, for example, all identified remaining DC/DC converters and inverters. In another embodiment, the selected portion may be less than all identified remaining DC/DC converters and inverters, such as only a single identified remaining DC/DC converters and inverters. In still another embodiment, the selected portion may include any one or more of DC/DC converters, inverters, supercapacitors, capacitors, batteries, and fuel cell stack segments.

In block 1310 the controller 1238 may determine an offset waveform for each selected remaining device such that a sum of each resulting ripple to be caused by the respective determined offset waveforms for each selected remaining device cancels the determined resulting ripple to be caused by the selected test waveform. In an embodiment, each offset waveform may be generated such that the resulting ripple is the same, such as one, two, three or more equal ripples that together cancel the ripple from the test waveform. In another embodiment, each offset waveform may be generated such that the resulting ripples are different, such as two, three, or more different ripples that together cancel the ripple from the test waveform.

In block 1312 the controller 1238 may control the DC/DC converter of the respective inverter selected for impedance testing to inject the test waveform into the selected inverter. For example, the controller 1238 may send control signals to a controller (e.g., 1230 or 1232) of the inverter to cause the converter to perform pulse width modulation to generate the test waveform on an input connection to the inverter. In block 1314 the controller 1238 may control the selected remaining devices to inject the offset waveform for each selected remaining inverters into each respective inverters. For example, the controller 1238 may send control signals to the controllers (e.g., 1230 or 1232) of the DC/DC converters to cause the converters to perform pulse width modulation to generate the offset waveforms on an input connection to their respective inverters. The operations of method 1300 performed in blocks 1312 and 1314 may occur simultaneously, such that the test waveform and offset waveforms are injected at the same time resulting in ripples being output from the various Inverters that cancel each other out resulting in a the desired AC voltage on the AC bus.

In block 1316 the controller 1238 may determine a characteristic of the inverter selected for impedance testing based at least in part on the impedance response. As discussed above, the controller may use EIS monitoring to plot the real and imaginary parts of the measured impedances resulting from the injected test waveform and compare the plotted impedances to the known signatures of impedance responses of inverters or capacitors with known characteristics. The known signatures of impedance responses of the of inverters or capacitors with known characteristics may be stored in a memory available to the controller. The stored known signatures of impedance responses of the of inverters or capacitors with known characteristics may be plots of the real and imaginary parts of the measured impedances of healthy of inverters or capacitors and damaged/degraded of inverters or capacitors derived from testing healthy (i.e., undamaged/undegraded) and damaged/degraded of inverters or capacitors with various forms of damage (e.g., anode cracking) and/or degradation of capacitance. The known characteristics may be correlated with the plots of the real and imaginary parts of the measured impedances stored in the memory.

By matching the measured impedances to the known signatures of impedance responses, the current characteristics or state of the inverter or its capacitor may be determined as those characteristics correlated with the matching known signature of impedance response. In optional block 1318 the controller 1238 may indicate a failure mode based on the determined characteristic exceeding a failure threshold. For example, if the determined characteristic exceeds a failure threshold a failure mode of an inverter or a capacitor a failure state may be indicated. In optional block 1320 the controller 1238 may adjust a setting of the inverter or the entire system based on the determined characteristic. For example, the controller 1238 may adjust (e.g., increase or decrease) drawn current from DC/DC converters to specific inverters or shut off of the DC/DC converters and their corresponding inverters based on the determined characteristic. In this manner, impedance testing, such as EIS monitoring, may be used to adjust the operation of the inverter based on current characteristics of the and inverter.

In summary, in one embodiment described above with respect to FIGS. 9A-9C, a system includes a direct current ("DC") bus, a first DC power source other than a fuel cell electrically connected via a first input connection to a first DC converter, wherein the first DC converter is connected via a first output connection to the DC bus, at least one second DC power source other than a fuel cell electrically connected via at least one second input connection to at least one second DC converter, wherein the at least one second DC converter is connected via at least second output connection to the DC bus and wherein the first output connection and the at least one second output connection connect the first DC converter and the at least one second DC converter to the DC bus in parallel and a processor connected to the first DC converter and the at least one second DC converter.

The processor is configured with processor-executable instructions to perform operations comprising selecting a test waveform to inject onto the first input connection from the first DC converter to the first DC power source other than a fuel cell, determining a first resulting ripple on the first output connection that will be generated in response to injecting the test waveform onto the first input connection, determining at least one offset waveform to inject onto the at least one second input connection from the at least one second DC converter to the at least one second DC power source other than a fuel cell such that one or more second ripples which will be provided to the at least one second output connection cancel the first resulting ripple, controlling the first DC converter to inject the test waveform onto the first input connection, and controlling the at least one second DC converter to inject the at least one offset waveform onto the at least one second input connection.

In one embodiment, at least one of the first DC power source other than a fuel cell and the at least one second DC power source other than a fuel cell each comprises at least one battery. In another embodiment, the at least one second DC power source other than a fuel cell comprises an electrolysis cell or an electrochemical pumping cell. In yet another embodiment, the at least one second DC power source other than a fuel cell comprises a supercapacitor, a photovoltaic device or a thermoelectric device.

In one embodiment, the processor is configured with processor-executable instructions to perform operations further comprising controlling the first DC converter to monitor an impedance response of the first DC power source other than a fuel cell using impedance spectroscopy ("EIS") in response to the injected test waveform, and determining a characteristic of the first DC power source other than a fuel cell based at least in part on the impedance response of the first DC power source other than a fuel cell. The processor may also be configured with processor-executable instructions to perform operations further comprising adjusting a setting of the first DC power source other than a fuel cell based on the determined characteristic. The determined characteristic may be one of a battery capacity, a battery state of charge (SoC), a battery state of health (SoH), and an overall battery lifetime. Adjusting a setting of the first DC power source other than a fuel cell may comprise adjusting a charging state of the first DC power source other than a fuel cell.

In another embodiment, the processor is configured with processor-executable instructions to perform operations further comprising determining whether the determined characteristic exceeds a failure threshold, and indicating a failure mode in response to determining the determined characteristic exceeds the failure threshold. The failure threshold may indicate a decreased battery capacity of the first DC power source other than a fuel cell and the failure mode includes decreasing power drawn from the first DC power source other than a fuel cell.

Furthermore, in the embodiment described above with respect to FIGS. 9A-9C, a method comprises selecting a test waveform to inject from a first DC converter to at least one first DC power source other than a fuel cell, determining a first resulting ripple that will be generated in response to injecting the test waveform onto the battery, determining at least one offset waveform to inject from at least one second DC converter to at least one second DC power source to generate one or more second ripples which cancel the first resulting ripple, injecting the test waveform from the first DC converter to the at least one first DC power source, injecting the at least one offset waveform from the at least one second DC converter to the at least one second DC power source, and determining a characteristic of the first DC power source based at least in part on the impedance response of the first DC power source.

In one embodiment, the at least one first DC power source other than a fuel cell comprises a battery. Determining the characteristic of the first DC power source may comprise determining if the battery is charging or discharging. Determining if the battery is charging or discharging may comprise determining that the battery is charging if the measurement indicates that the first resulting ripple has been cancelled, and determining that the battery is discharging if the measurement indicates that the first resulting ripple has not been cancelled. In one embodiment, determining the characteristic of the first DC power source comprises determining at least one of a battery capacity, a battery state of charge (SoC), a battery state of health (SoH), and an overall battery lifetime.

In another embodiment described above with respect to FIGS. 10 and 11, a system comprises an alternating current ("AC") bus, a first direct current ("DC") power source electrically connected via a first input connection to a first inverter, wherein the first inverter is connected via a first output connection to the AC bus, at least one second DC power source electrically connected via at least one second input connection to at least one second inverter, wherein the at least one second inverter is connected via at least second output connection to the AC bus and wherein the first output connection and the at least one second output connection connect the first inverter and the at least one second inverter to the AC bus in parallel, and a processor connected to the first inverter and the at least one second inverter.

The processor is configured with processor-executable instructions to perform operations comprising selecting a test waveform to inject onto the first input connection from the first inverter to the first DC power source, determining a first resulting ripple on the first output connection that will be generated in response to injecting the test waveform onto the first input connection, determining at least one offset waveform to inject onto the at least one second input connection from the at least one second inverter to the at least one second DC power source such that one or more second ripples which will be provided to the at least one second output connection cancel the first resulting ripple, controlling the first inverter to inject the test waveform onto the first input connection, and controlling the at least one second inverter to inject the at least one offset waveform onto the at least one second input connection.

In one embodiment, the processor is configured with processor-executable instructions to perform operations further comprising controlling the first inverter to monitor a first impedance response of the first DC power source using impedance spectroscopy ("EIS") in response to the injected first test waveform, and determining a characteristic of the first DC power source based at least in part on the first impedance response of the first DC power source. The first DC power source may comprise at least one of a fuel cell stack, an electrolysis cell, an electrochemical pumping cell, a battery, a supercapacitor, a photovoltaic device or a thermoelectric device, and the processor may be configured with processor-executable instructions to perform operations further comprising adjusting a setting of the first DC power source based on the determined characteristic. In one embodiment, the first DC power source comprises the battery, the determined characteristic is one of a battery capacity, a battery state of charge (SoC), a battery state of health (SoH), and an overall battery lifetime, and adjusting a setting of the first DC power source comprises adjusting a charging state of the first DC power source.

In another embodiment, the processor is configured with processor-executable instructions to perform operations further comprising determining whether the determined characteristic exceeds a failure threshold, and indicating a failure mode in response to determining the determined characteristic exceeds the failure threshold.

In another embodiment described above with respect to FIGS. 12 and 13, a system comprises an alternating current ("AC") bus, a first direct current ("DC") power source electrically connected via a first DC power source input connection to a first DC converter, a first inverter connected to the first DC converter via a first DC converter output connection and connected to the AC bus via a first inverter output connection, and a processor connected to the first DC converter. The processor is configured with processor-executable instructions to perform operations comprising selecting a test waveform to inject onto the first DC converter output connection from the first DC converter to the first inverter, controlling the first DC converter to inject the test waveform onto the first DC converter output connection, and measuring a response from the inverter to the test waveform.

In one embodiment, the processor is further configured to perform operations comprising relating the measured response to an operational state of one or more capacitors in the first inverter. The operational state may include at least one of a capacitance range related to the overall functioning of the inverter, a predicted lifetime of the capacitor, or a capacitance of the capacitor. In one embodiment, relating the measured response to an operational state of one or more capacitors comprises comparing the measured response to a stored response of a capacitor in a properly functioning inverter.

According to another embodiment described above with respect to FIGS. 9A-9E, a system includes a direct current ("DC") bus, a battery electrically connected via a first input connection to a first DC converter, wherein the first DC converter is connected via a first output connection to the DC bus, at least one second DC power source electrically connected via at least one second input connection to at least one second DC converter, wherein the at least one second DC converter is connected via at least second output connection to the DC bus and wherein the first output connection and the at least one second output connection connect the first DC converter and the at least one second DC converter to the DC bus in parallel, and a processor connected to the first DC converter and the at least one second DC converter. The processor is configured with processor-executable instructions to perform operations comprising selecting a test waveform to inject onto the first input connection from the first DC converter to the battery, determining a first resulting ripple on the first output connection that will be generated in response to injecting the test waveform onto the first input connection, determining at least one offset waveform to inject onto the at least one second input connection from the at least one second DC converter to the at least one second DC power source such that one or more second ripples which will be provided to the at least one second output connection will cancel the first resulting ripple if the battery is charging, controlling the first DC converter to inject the test waveform onto the first input connection, controlling the at least one second DC converter to inject the at least one offset waveform onto the at least one second input connection, measuring an output on the first DC converter output connection, and determining if the battery is charging or discharging based on the measured output.

In one embodiment, determining if the battery is charging or discharging comprises determining that the battery is charging if the measurement indicates that the first resulting ripple has been cancelled, and determining that the battery is discharging if the measurement indicates that the first resulting ripple has not been cancelled.

In another embodiment, the operations further comprise monitoring an impedance response of the battery using electrochemical impedance spectroscopy ("EIS") in response to the injected test waveform, and determining a characteristic of the battery based at least in part on the impedance response of the battery. The operations may further comprise adjusting a setting of the battery based on the determined characteristic. The determined characteristic may be one of a battery capacity, a battery state of charge (SoC), a battery state of health (SoH), and an overall battery lifetime, and the operations may further comprise adjusting a setting of the battery comprises adjusting a charging state of the battery.

In another embodiment, the operations further comprise determining whether the determined characteristic exceeds a failure threshold, and indicating a failure mode in response to determining the determined characteristic exceeds the failure threshold. The failure threshold may indicates a decreased battery capacity of the battery and the operations may further comprise decreasing power drawn from the battery in response to the indication of the failure mode. The at least one second DC power source may comprise a battery, at least one fuel cell stack segment, electrolysis cells, or electrochemical pumping cells.

In the embodiment described above with respect to FIGS. 9A-9E, a method includes selecting a test waveform to inject to a battery from a first DC converter, determining a first resulting ripple that will be generated in response to injecting the test waveform, determining at least one offset waveform to inject to at least one second DC power source from at least one second DC converter such that one or more second ripples will be provided that will cancel the first resulting ripple if the battery is charging, injecting the test waveform to the battery, injecting the at least one offset waveform to the at least one second DC power source, determining if the first resulting ripple has been cancelled, and determining if the battery is charging or discharging based on the step of determining if the first resulting ripple has been cancelled.

In one embodiment, determining if the first resulting ripple has been cancelled comprises determining that the battery is charging if the first resulting ripple has been cancelled, and determining that the battery is discharging if the first resulting ripple has not been cancelled.

In one embodiment, the method further comprises monitoring an impedance response of the battery using electrochemical impedance spectroscopy ("EIS") in response to the injected test waveform, and determining a characteristic of the battery based at least in part on the impedance response of the battery. The method may further comprise adjusting a setting of the battery based on the determined characteristic. The determined characteristic may be one of a battery capacity, a battery state of charge (SoC), a battery state of health (SoH), and an overall battery lifetime, and adjusting a setting of the battery may comprise adjusting a charging state of the battery.

In another embodiment, the method further comprises determining whether the determined characteristic exceeds a failure threshold, and indicating a failure mode in response to determining the determined characteristic exceeds the failure threshold. The failure threshold may indicate a decreased battery capacity of the battery, and the method may further comprise decreasing power drawn from the battery in response to the indication of the failure mode. The at least one second DC power source may comprise a battery, at least one fuel cell stack segment, electrolysis cells, or electrochemical pumping cells.

One or more diagrams have been used to describe exemplary embodiments. The use of diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements may be implemented using computing devices (such as computer) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. A system of, comprising:
   a direct current ("DC") bus;
   a first DC power source other than a fuel cell electrically connected via a first input connection to a first DC converter, wherein the first DC converter is connected via a first output connection to the DC bus;
   at least one second DC power source other than a fuel cell electrically connected via at least one second input connection to at least one second DC converter, wherein the at least one second DC converter is connected via at least one second output connection to the DC bus and wherein the first output connection and the at least one second output connection connect the first DC converter and the at least one second DC converter to the DC bus in parallel; and a processor connected to the first DC converter and the at least one second DC converter, wherein the processor is configured with processor-executable instructions to perform operations comprising:

selecting a test waveform to inject onto the first input connection from the first DC converter to the first DC power source other than a fuel cell;

determining a first resulting ripple on the first output connection that will be generated in response to injecting the test waveform onto the first input connection;

determining at least one offset waveform to inject onto the at least one second input connection from the at least one second DC converter to the at least one second DC power source other than a fuel cell such that one or more second ripples which will be provided to the at least one second output connection to cancel the first resulting ripple;

controlling the first DC converter to inject the test waveform onto the first input connection; and controlling the at least one second DC converter to inject the at least one offset waveform onto the at least one second input connection;

wherein at least one of the first DC power source other than a fuel cell and the at least one second DC power source other than a fuel cell each comprises at least one battery;

wherein the processor is configured with processor-executable instructions to perform operations further comprising:

controlling the first DC converter to monitor an impedance response of the first DC power source other than a fuel cell using impedance spectroscopy ("EIS") in response to the injected test waveform; and determining a characteristic of the first DC power source other than a fuel cell based at least in part on the impedance response of the first DC power source other than a fuel cell;

adjusting a setting of the first DC power source other than a fuel cell based on the determined characteristic;

wherein:

the determined characteristic is one of a battery capacity, a battery state of charge (SoC), a battery state of health (SoH), and an overall battery lifetime; and adjusting a setting of the first DC power source other than a fuel cell comprises adjusting a charging state of the first DC power source other than a fuel cell.

2. A system, comprising:

a direct current ("DC") bus;

a first DC power source other than a fuel cell electrically connected via a first input connection to a first DC converter, wherein the first DC converter is connected via a first output connection to the DC bus;

at least one second DC power source other than a fuel cell electrically connected via at least one second input connection to at least one second DC converter, wherein the at least one second DC converter is connected via at least one second output connection to the DC bus and wherein the first output connection and the at least one second output connection connect the first DC converter and the at least one second DC converter to the DC bus in parallel; and a processor connected to the first DC converter and the at least one second DC converter, wherein the processor is configured with processor-executable instructions to perform operations comprising:

selecting a test waveform to inject onto the first input connection from the first DC converter to the first DC power source other than a fuel cell;

determining a first resulting ripple on the first output connection that will be generated in response to injecting the test waveform onto the first input connection;

determining at least one offset waveform to inject onto the at least one second input connection from the at least one second DC converter to the at least one second DC power source other than a fuel cell such that one or more second ripples which will be provided to the at least one second output connection to cancel the first resulting ripple;

controlling the first DC converter to inject the test waveform onto the first input connection; and controlling the at least one second DC converter to inject the at least one offset waveform onto the at least one second input connection;

wherein at least one of the first DC power source other than a fuel cell and the at least one second DC power source other than a fuel cell each comprises at least one battery;

wherein the processor is configured with processor-executable instructions to perform operations further comprising:

controlling the first DC converter to monitor an impedance response of the first DC power source other than a fuel cell using impedance spectroscopy ("EIS") in response to the injected test waveform; and determining a characteristic of the first DC power source other than a fuel cell based at least in part on the impedance response of the first DC power source other than a fuel cell;

determining whether the determined characteristic exceeds a failure threshold; and indicating a failure mode in response to determining the determined characteristic exceeds the failure threshold; and wherein the failure threshold indicates a decreased battery capacity of the first DC power source other than a fuel cell and the failure mode includes decreasing power drawn from the first DC power source other than a fuel cell.

3. The system of claim 2, wherein the at least one second DC power source other than a fuel cell comprises an electrolysis cell or an electrochemical pumping cell.

4. The system of claim 2, wherein the at least one second DC power source other than a fuel cell comprises a supercapacitor, a photovoltaic device or a thermoelectric device.

5. A system, comprising:

an alternating current ("AC") bus;

a first direct current ("DC") power source electrically connected via a first input connection to a first inverter, wherein the first inverter is connected via a first output connection to the AC bus;

at least one second DC power source electrically connected via at least one second input connection to at least one second inverter, wherein the at least one second inverter is connected via at least one second output connection to the AC bus and wherein the first output connection and the at least one second output connection connect the first inverter and the at least one second inverter to the AC bus in parallel; and a processor connected to the first inverter and the at least one second inverter, wherein the processor is configured with processor-executable instructions to perform operations comprising:

selecting a test waveform to inject onto the first input connection from the first inverter to the first DC power source;

determining a first resulting ripple on the first output connection that will be generated in response to injecting the test waveform onto the first input connection;

determining at least one offset waveform to inject onto the at least one second input connection from the at least one second inverter to the at least one second DC power source such that one or more second ripples which will be provided to the at least one second output connection to cancel the first resulting ripple;

controlling the first inverter to inject the test waveform onto the first input connection; and controlling the at least one second inverter to inject the at least one offset waveform onto the at least one second input connection.

6. The system of claim 5, wherein the processor is configured with processor-executable instructions to perform operations further comprising:

controlling the first inverter to monitor a first impedance response of the first DC power source using impedance spectroscopy ("EIS") in response to the injected first test waveform; and determining a characteristic of the first DC power source based at least in part on the first impedance response of the first DC power source.

7. The system of claim 6, wherein:

the first DC power source comprises at least one of a fuel cell stack, an electrolysis cell, an electrochemical pumping cell, a battery, a supercapacitor, a photovoltaic device or a thermoelectric device; and the processor is configured with processor-executable instructions to perform operations further comprising adjusting a setting of the first DC power source based on the determined characteristic.

8. The system of claim 7, wherein:

the first DC power source comprises the battery;

the determined characteristic is one of a battery capacity, a battery state of charge (SoC), a battery state of health (SoH), and an overall battery lifetime; and adjusting a setting of the first DC power source comprises adjusting a charging state of the first DC power source.

9. The system of claim 6, wherein the processor is configured with processor-executable instructions to perform operations further comprising:

determining whether the determined characteristic exceeds a failure threshold; and indicating a failure mode in response to determining the determined characteristic exceeds the failure threshold.

10. A system of, comprising:

an alternating current ("AC") bus;

a first direct current ("DC") power source electrically connected via a first DC power source input connection to a first DC converter;

a first inverter connected to the first DC converter via a first DC converter output connection and connected to the AC bus via a first inverter output connection; and a processor connected to the first DC converter, wherein the processor is configured with processor-executable instructions to perform operations comprising:

selecting a test waveform to inject onto the first DC converter output connection from the first DC converter to the first inverter;

controlling the first DC converter to inject the test waveform onto the first DC converter output connection;

measuring a response from the inverter to the test waveform; and relating the measured response to an operational state of one or more capacitors in the first inverter; and wherein the operational state includes at least one of a capacitance range related to the overall functioning of the inverter, a predicted lifetime of the capacitor, or a capacitance of the capacitor.

11. A system of, comprising:

an alternating current ("AC") bus;

a first direct current ("DC") power source electrically connected via a first DC power source input connection to a first DC converter;

a first inverter connected to the first DC converter via a first DC converter output connection and connected to the AC bus via a first inverter output connection; and a processor connected to the first DC converter, wherein the processor is configured with processor-executable instructions to perform operations comprising:

selecting a test waveform to inject onto the first DC converter output connection from the first DC converter to the first inverter;

controlling the first DC converter to inject the test waveform onto the first DC converter output connection;

measuring a response from the inverter to the test waveform; and relating the measured response to an operational state of one or more capacitors in the first inverter; and wherein relating the measured response to an operational state of one or more capacitors comprises comparing the measured response to a stored response of a capacitor in a properly functioning inverter.

12. A method of, comprising:

selecting a test waveform to inject from a first DC converter to at least one first DC power source other than a fuel cell;

determining a first resulting ripple that will be generated in response to injecting the test waveform onto a battery;

determining at least one offset waveform to inject from at least one second DC converter to at least one second DC power source to generate one or more second ripples which cancel the first resulting ripple;

injecting the test waveform from the first DC converter to the at least one first DC power source:

injecting the at least one offset waveform from the at least one second DC converter to the at least one second DC power source; and determining a characteristic of the first DC power source based at least in part on an impedance response of the first DC power source;

wherein the at least one first DC power source other than a fuel cell comprises a battery;

wherein determining the characteristic of the first DC power source comprises determining if the battery is charging or discharging; and wherein determining if the battery is charging or discharging comprises:
- determining that the battery is charging if the measurement indicates that the first resulting ripple has been cancelled; and
- determining that the battery is discharging if the measurement indicates that the first resulting ripple has not been cancelled.

13. The method of claim 12, wherein determining the characteristic of the first DC power source comprises determining at least one of a battery capacity, a battery state of charge (SoC), a battery state of health (SoH), and an overall battery lifetime.

* * * * *